US009953985B2

(12) United States Patent
Kim et al.

(10) Patent No.: US 9,953,985 B2
(45) Date of Patent: Apr. 24, 2018

(54) METHOD OF MANUFACTURING INTEGRATED CIRCUIT DEVICE

(71) Applicant: SAMSUNG ELECTRONICS CO., LTD., Suwon-si, Gyeonggi-do (KR)

(72) Inventors: Hyun-gi Kim, Hwaseong-si (KR); Sang-moo Jeong, Seoul (KR); Seon-ju Kim, Suwon-si (KR); Hye-won Kim, Gimhae-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/629,523

(22) Filed: Jun. 21, 2017

(65) Prior Publication Data
US 2018/0012894 A1    Jan. 11, 2018

(30) Foreign Application Priority Data
Jul. 6, 2016 (KR) .................. 10-2016-0085599

(51) Int. Cl.
*H01L 27/108* (2006.01)
*H01L 21/306* (2006.01)
(Continued)

(52) U.S. Cl.
CPC .. *H01L 27/10891* (2013.01); *H01L 21/30604* (2013.01); *H01L 21/31051* (2013.01);
(Continued)

(58) Field of Classification Search
CPC .......... H01L 27/1089; H01L 21/30604; H01L 21/31051; H01L 21/31111;
(Continued)

(56) References Cited

U.S. PATENT DOCUMENTS 6,709,972 B2 *  3/2004  Park .................. H01L 21/76897
                                                 257/E21.507
6,916,738 B2 *  7/2005  Lee ................... H01L 27/10855
                                                 257/E21.649
(Continued)

FOREIGN PATENT DOCUMENTS

KR    10-2007-0058112 A    6/2007
KR    10-2008-0089999 A    10/2008
(Continued)

Primary Examiner — Karen Kusumakar
(74) Attorney, Agent, or Firm — Lee & Morse, P.C.

(57) ABSTRACT

A method of manufacturing an integrated circuit device includes forming multilayered stack structures that extend parallel to and separated from one another on a substrate, followed by forming a buried conductive layer including a plurality of conductive line patterns that extend parallel to an extending direction of the multilayered stack structures and alternate with the multilayered stack structures; removing portions of the buried conductive layer to thereby separate the plurality of conductive line patterns of the buried conductive layer from one another as a plurality of contact plugs and, at the same time, form a plurality of insulating fence spaces that alternate with the plurality of contact plugs in the extending direction of the multilayered stack structures; and forming a plurality of insulating fences that fill the plurality of insulating fence spaces and include a plurality of insulating line patterns extending parallel to one another.

20 Claims, 27 Drawing Sheets

(51) Int. Cl.
  *H01L 21/311* (2006.01)
  *H01L 21/3105* (2006.01)
  *H01L 21/3213* (2006.01)
  *H01L 21/768* (2006.01)

(52) U.S. Cl.
  CPC .. *H01L 21/31111* (2013.01); *H01L 21/32133* (2013.01); *H01L 21/32139* (2013.01); *H01L 21/76895* (2013.01); *H01L 21/76897* (2013.01); *H01L 27/10814* (2013.01); *H01L 27/10823* (2013.01); *H01L 27/10885* (2013.01); *H01L 27/10888* (2013.01)

(58) Field of Classification Search
  CPC ......... H01L 21/32133; H01L 21/32139; H01L 21/76895; H01L 21/76897; H01L 27/10814; H01L 27/10823; H01L 27/10885; H01L 27/10888
  See application file for complete search history.

(56) References Cited

U.S. PATENT DOCUMENTS

| | | | |
|---|---|---|---|
| 8,569,817 B2 * | 10/2013 | Kwon | ............... H01L 27/10823 257/302 |
| 9,184,168 B2 | 11/2015 | Ryu et al. | |
| 9,184,227 B1 | 11/2015 | Kim et al. | |
| 2015/0115392 A1 | 4/2015 | Yoon et al. | |
| 2016/0056158 A1 | 2/2016 | Ryu et al. | |

FOREIGN PATENT DOCUMENTS

| | | |
|---|---|---|
| KR | 10-2011-0109725 A | 10/2011 |
| KR | 10-2014-0062601 A | 5/2014 |

* cited by examiner

METHOD OF MANUFACTURING INTEGRATED CIRCUIT DEVICE

CROSS-REFERENCE TO RELATED APPLICATION

Korean Patent Application No. 10-2016-0085599, filed on Jul. 6, 2016, in the Korean Intellectual Property Office, and entitled: "Method of Manufacturing Integrated Circuit Device," is incorporated by reference herein in its entirety.

BACKGROUND

1. Field

Embodiments relate to a method of manufacturing an integrated circuit (IC) device, and more particularly, to a method of manufacturing an IC device having a field effect transistor (FET) including a plurality of contact plugs adjacent to one another.

2. Description of the Related Art

With the development of electronic technology, recently, semiconductor devices have been down-scaled rapidly. A gap distance from a plurality of interconnection lines to a plurality of contact plugs between the interconnection lines is also gradually decreasing. Accordingly, a process of manufacturing an IC device is becoming difficult with increased process variations, adversely affecting the reliability of the IC device.

SUMMARY

One or more embodiments provide a method of manufacturing an integrated circuit device, the method including forming a plurality of multilayered stack structures that extend parallel to and separated from one another on a substrate. A buried conductive layer including a plurality of conductive line patterns that extend parallel to an extending direction of the multilayered stack structures is formed, each of the plurality of conductive line patterns being interposed between each of the multilayered stack structures. Portions of the buried conductive layer that correspond to a plurality of fence line areas which are spaced apart from one another and extend parallel to one another in a direction crossing the extending direction of the multilayered stack structures are removed to thereby separate the plurality of line patterns line patterns of the buried conductive layer from one another as a plurality of contact plugs and at the same time form a plurality of insulating fence spaces that alternate with the plurality of contact plugs in the extending direction of the multilayered stack structures. Then, a plurality of insulating fences that include a plurality of insulating line patterns filling the plurality of insulating fence spaces and extending parallel to one another along the plurality of fence line areas are formed.

One or more embodiments provide a method of manufacturing an integrated circuit device, the method including forming a plurality of first conductive lines in a substrate to extend parallel to one another in a first direction. A plurality of second conductive lines are formed on the substrate to extend parallel to one another in a second direction that intersects the first direction. A buried conductive layer including a plurality of conductive line patterns that extend on the substrate parallel to the second direction is formed, each of the plurality of conductive line patterns being interposed between each of the plurality of second conductive lines. Portions of the buried conductive layer that vertically overlap with the plurality of first conductive lines are removed to thereby separate the plurality of conductive line patterns of the buried conductive layer from one another as a plurality of contact plugs and at the same time form a plurality of insulating fence spaces that alternate with the plurality of contact plugs in the second direction. Then, a plurality of insulating fences that include a plurality of insulating line patterns filling the plurality of insulating fence spaces, vertically overlapping with the plurality of first conductive lines, and extending parallel to one another, are formed.

A method of manufacturing an integrated circuit device, the method including forming a plurality of first conductive lines in a substrate to extend parallel to one another in a first direction, forming a plurality of second conductive lines on the substrate to extend parallel to one another in a second direction that intersects the first direction, and forming a plurality of spaces that extend on the substrate parallel to the second direction, each of the plurality of spaces being interposed between each of the plurality of second conductive lines. A plurality of contact plugs may be formed by filling first spaces of the plurality of spaces that extend into the substrate with a conductive material. Insulating fences that include a plurality of insulating line patterns extending parallel to one another may be formed by filling second spaces that overlap the plurality of first conductive lines in a third direction that intersects the first and second direction with an insulating material.

BRIEF DESCRIPTION OF THE DRAWINGS

Features will become apparent to those of skill in the art by describing in detail exemplary embodiments with reference to the attached drawings in which:

FIGS. 3A to 3O illustrate cross-sectional views of sequential stages of a method of manufacturing an IC device, according to exemplary embodiments. In particular, FIGS. 3A to 3J and FIG. 3O are cross-sectional views illustrating sequential stages of forming the regions of the IC device corresponding to the regions taken along line A-A' and line B-B' of FIG. 1, and FIGS. 3K, 3L, 3M, and 3N are cross-sectional and plan views illustrating sequential stages of forming the regions corresponding to the regions taken along line A-A' and line B-B' of FIG. 1:

DETAILED DESCRIPTION

Figure 1:
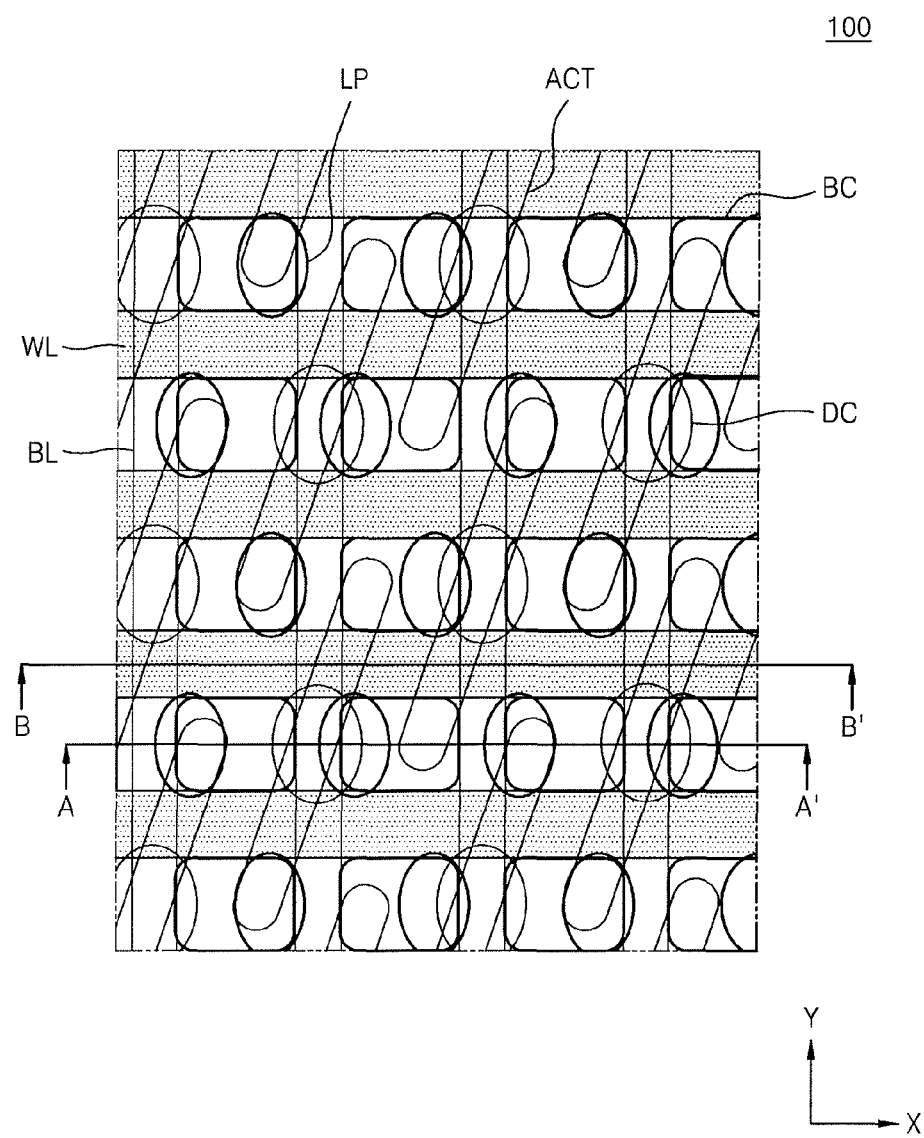
FIG. 1 illustrates a schematic planar layout of essential parts in a memory cell array region of an integrated circuit (IC) device, according to exemplary embodiments.

FIG. 1 is a schematic planar layout illustrating essential parts in a memory cell array region of an integrated circuit (IC) device 100, according to exemplary embodiments.

Referring to FIG. 1, an IC device 100 according to an embodiment may include a plurality of active regions ACT. The plurality of active regions ACT may be disposed in a diagonal direction with respect to a first direction (X direction) and a second direction (Y direction).

A plurality of word lines WL may extend parallel to one another across a plurality of active regions ACT in the first direction (X direction). A plurality of bit lines BL may extend parallel to one another over the plurality of word lines WL in the second reaction (Y direction) that intersects the first direction (X direction).

The plurality of bit lines BL may be connected with the plurality of active regions ACT through direct contacts DC.

In some exemplary embodiments, a plurality of buried contacts BC may be formed between two adjacent bit lines BL. In some exemplary embodiments, the plurality of buried contacts BC may be arranged in a matrix pattern in the first direction (X direction) and the second direction (Y direction).

A plurality of conductive landing pads LP may be respectively formed on the plurality of buried contacts BC. The plurality of buried contacts BC and the plurality of conductive landing pads LP may connect lower electrodes of capacitors formed on the plurality of bit lines BL to the active regions ACT. The plurality of conductive landing pads LP may partially overlap the buried contacts BC, respectively.

Figure 2:
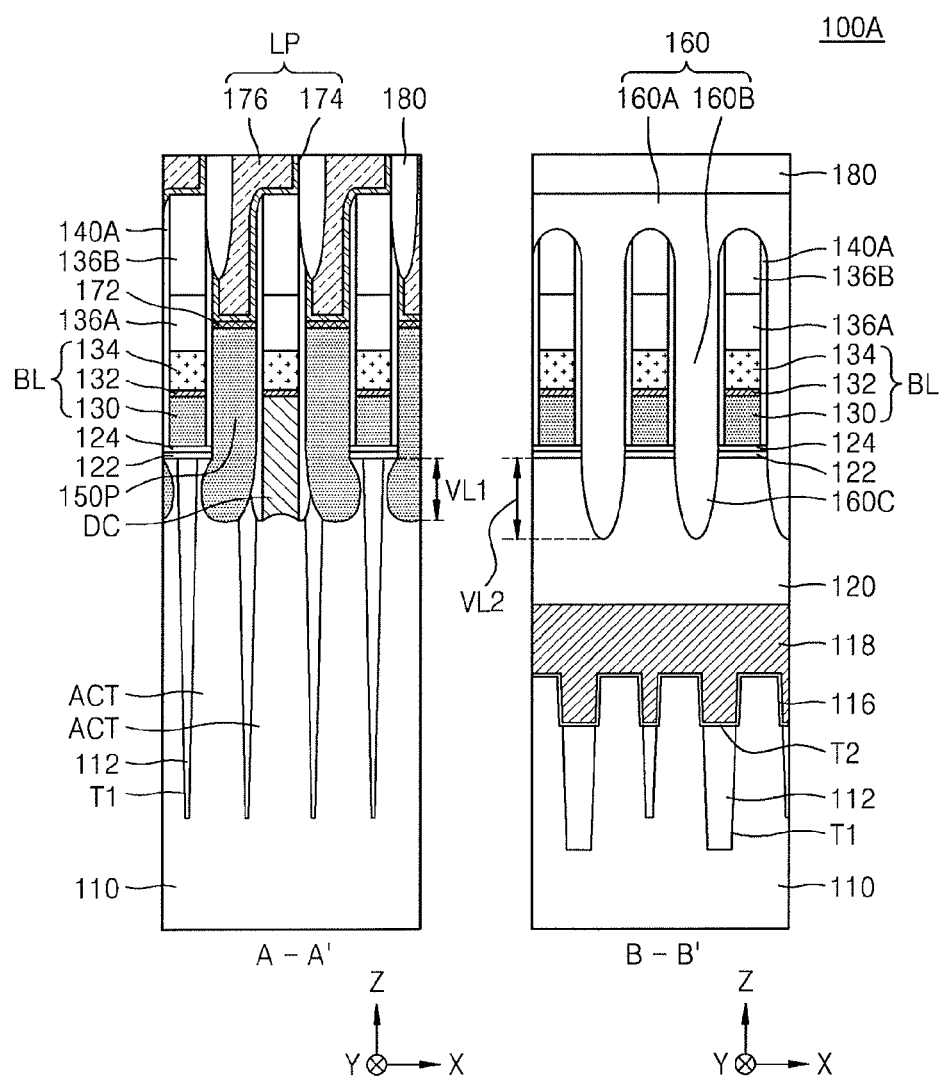
FIG. 2 illustrates a cross-sectional view illustrating an IC device according to exemplary embodiments, which correspond to the regions taken along line A-A' and line B-B' of FIG. 1.

FIG. 2 is a cross-sectional view illustrating essential parts of an IC device 100A according to exemplary embodiments. The IC device 100A of FIG. 2 may have the same layout as the IC device 100 of FIG. 1. FIG. 2 illustrates exemplary cross-sections of the main elements of the IC device 100A that correspond to the regions taken along line A-A' and line B-B' of FIG. 1.

Referring to FIG. 2, the IC device 100A may include a substrate 110, in which a plurality of active regions ACT are defined by device isolation layer 112. The device isolation layer 112 may be formed in device isolation trench T1 of the substrate 110.

In some exemplary embodiments, the substrate 110 may include silicon, e.g., single crystalline silicon, polycrystalline silicon, or amorphous silicon. In some other embodiments, the substrate 110 may include at least one of germanium (Ge), silicon germanium (SiGe), silicon carbide (SiC), gallium arsenide (GaAs), indium arsenide (InAs), and indium phosphide (InP). In some exemplary embodiments, the substrate 110 may include a conductive region, e.g., a well doped with impurities or a structure doped with impurities.

A plurality of word line trenches T2 that extend in the first direction (X direction) may be formed in the substrate 110. A plurality of gate dielectric layers 116 and a plurality of word lines 118 may be formed in the plurality of word line trenches T2. The plurality of word lines 118 may respectively correspond to the plurality of word lines WL of FIG. 1.

Direct contacts DC may be formed on some of the plurality of active regions ACT.

A first insulating layer 122 and a second insulating layer 124 may be sequentially formed on the substrate 110. The first insulating layer 122 and the second insulating layer 124 may include silicon oxide, silicon nitride, or a combination thereof. A plurality of bit lines BL that extend parallel to one another in the second direction (Y direction) may be formed on the second insulating layer 124. The plurality of bit lines BL may be connected to the active regions ACT through the direct contacts DC.

In some exemplary embodiments, the direct contacts DC may include silicon (Si), germanium (Ge), tungsten (W), tungsten nitride (WN), cobalt (Co), nickel (Ni), aluminium (Al), molybdenum (Mo), ruthenium (Ru), titanium (Ti), titanium nitride (TiN), tantalum (Ta), tantalum nitride (TaN), copper (Cu), or a combination thereof. In some exemplary embodiments, the direct contacts DC may include an epitaxial silicon layer.

The plurality of bit lines BL may include a first conductive layer 130, a third conductive layer 132, and a fourth conductive layer 134 that are sequentially formed on the substrate 110. The plurality of bit lines BL may be covered with first and second capping layers 136A and 136B. An upper surface of the first conductive layer 130 and an upper surface of the direct contact DC may be on the same plane. Although in FIG. 2 the plurality of bit lines BL are illustrated as a triple-layer conductive stack structure including the first conductive layer 130, the third conductive layer 132, and the fourth conductive layer 134, embodiments are not limited thereto. For example, the plurality of bit lines BL may have a single layer structure, a double layer structure, or a multilayered stack structure including at least four layers.

In some exemplary embodiments, the first conductive layer 130 may include a conductive polysilicon. The third conductive layer 132 and the fourth conductive layer 134 may each independently include TiN, TiSiN, W, tungsten silicide, or a combination thereof. However, embodiments are not limited thereto. For example, the third conductive layer 132 may include TiN and/or TiSiN, and the fourth conductive layer 134 may include tungsten (W).

Opposite sidewalls of the plurality of bit lines BL and opposite sidewalls of the first and second capping layers 136A and 136B may be covered with insulating spacers 140A. In other words, the insulating spacers 140A may extend along a third direction (Z direction) from some portion above a lower surface (closest to the substrate 110) of the second capping layer 136B along the first capping layer 136A and the bit line BL to the second insulating layer 124. The insulating spacers 140A may start at different portions for different sidewalls, e.g., due to the presence of insulating layer 180.

The insulating spacers 140A may include an oxide layer, a nitride layer, or a combination thereof. In some exemplary embodiments, the insulating spacers 140A may include an air spacer.

A plurality of contact plugs 150P may be formed in the spaces between the plurality of bit lines BL, respectively. The plurality of contact plugs 150P may include an impurity-doped semiconductor material, a metal, a conductive metal nitride, a metal silicide, or a combination thereof. However, embodiments are not limited thereto.

The plurality of contact plugs 150P that are arranged between each of the bit lines BL in a line in an extending direction (Y direction) of the bit lines BL may be insulated from one another by a plurality of insulating fences 160. The plurality of insulating fences 160 may include a silicon nitride layer. However, embodiments are not limited thereto. The plurality of insulating fences 160 may include a plurality of insulating line patterns that extend parallel to one another in a direction that intersects the extending direction (Y direction) of the plurality of bit lines BL, for example, in a direction (X direction) orthogonal to the extending direction (Y direction) of the plurality of bit lines BL. Each of the plurality of insulating fences 160 may include one insulating line portion 160A that extends on, e.g., covers, the plurality of second capping patterns 136B in a direction that intersects the plurality of second capping patterns 136B, and a plurality of insulating plug portions 160B that extend from the insulating line portion 160A toward the substrate 110, e.g., such that an end portion 160C thereof is closer to the substrates 110 than the first insulating layer 122.

Opposite sidewalls of the insulating line portion 160A may face a pair of contact plugs 150P of the plurality of contact plugs 150P adjacent to the opposite sidewalls of the insulating line portion 160A. Opposite sidewalls of each of the plurality of insulating plug portions 160B in the X direction may face a pair of bit lines BL, and opposite sidewalls of each of the plurality of insulating plug portions 160B in the Y direction may face a pair of contact plugs 150P. End portions 160C of the plurality of insulating plug portions 160B may be in a buried insulating layer 120 covering the word line 118. A vertical direction (Z direction) length VL2 of the end portions 160C of the plurality of insulating plug portions 160B that are buried in the buried insulating layer 120 may be greater than a vertical direction (Z direction) length VL1 of portions of the plurality of contact plugs 150P that are buried in the substrate 110.

A metal silicide layer 172 and a plurality of conductive landing pads LP may be sequentially formed on the plurality of contact plugs 150P between the plurality of first and second capping patterns 136A and 136B. The plurality of conductive landing pad LP may be connected with the plurality of contact plugs 150P through the metal silicide layer 172.

In some exemplary embodiments, the metal silicide layer 172 may include cobalt silicide, nickel silicide, or manganese silicide. However, embodiments are not limited thereto. In some exemplary embodiments, the metal silicide layer 172 may be omitted.

The plurality of conductive landing pads LP may each extend in the spaces between each of the plurality of first and second capping patterns 136A and 136B, to vertically overlap with some of the plurality of bit lines BL. The plurality of conductive landing pads LP may extend to the upper surfaces of the plurality of first and second capping patterns 136A and 136B, e.g., may start below an upper surface of the first capping pattern 136A and may end above an upper surface of the second capping pattern 136B. Each of the plurality of conductive landing pads LP may include a conductive barrier layer 174 and a conductive layer 176. The conductive layer 176 may be on the conductive barrier layer 174 to fill the spaces between the first and second capping patterns 136A and 136B and extend to an upper surface of the plurality of first and second capping patterns 136A and 136B.

In some exemplary embodiments, the conductive barrier layer 174 may include a Ti/TiN stack structure. The conductive layer 176 may include a doped polysilicon, a metal, a metal silicide, a conductive metal nitride, or a combination thereof. The conductive layer 176 may include a metal, a metal nitride, a conductive polysilicon, or a combination thereof. For example, the conductive layer 176 may include tungsten (W). In a plan view, the plurality of conductive landing pads LP may have an island pattern. The plurality of conductive landing pads LP may be electrically insulated from one another by insulating layer 180 that fills spaces around the plurality of conductive landing pads LP.

The plurality of contact plugs 150P may electrically connect lower electrodes of capacitors of the IC device 100A with the active regions ACT of the substrate 110. The plurality of contact plugs 150P may substantially have a uniform vertical length with a reduced depth variation. The IC device 100A may include the plurality of insulating fences 160 that insulate two adjacent contact plugs 150P from one another. The plurality of insulating plug portions 160B of the plurality of insulating fences 160 may substantially have a uniform vertical length with a reduced depth variation. Accordingly, it may be possible to prevent etch depth variations at different positions of the IC device 100A and electrical characteristic deterioration caused by such etch depth variations, and thus an IC device with improved reliability may be provided.

Figure 3A:
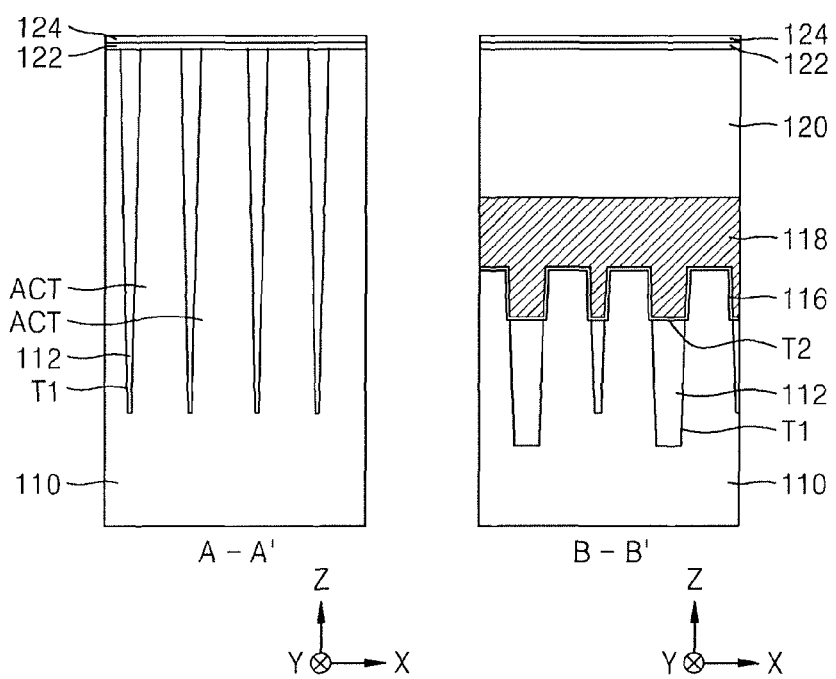

FIGS. 3A to 3O are cross-sectional views illustrating sequential stages of a method of manufacturing an IC device, according to exemplary embodiments. A method of manufacturing an IC device 100A, according to embodiments, now will be described with reference to FIGS. 3A to 3O.

Referring to FIG. 3A, device isolation trench T1 may be formed in the substrate 110, and device isolation layer 112 may be formed in the device isolation trench T1.

Active regions ACT may be defined in the substrate 110 by the device isolation layer 112. The device isolation layer 112 may be formed of an oxide layer, a nitride layer, or a combination thereof. The device isolation layer 112 may be formed as a single layer including an insulating layer, a double layer including two insulating layers including different materials, and a multilayer structure including at least three insulating layers including different materials.

A plurality of word line trenches T2 may be formed in the substrate 110. The plurality of word line trenches 120T may extend parallel to one another in a line pattern across the active regions ACT. As illustrated in the cross-sectional view taken along line B-B', to form the plurality of word line trenches T2 having bottom surfaces with step differences, the device isolation layer 112 and the substrate 110 may be etched by a separate etching process to have different etch depths from each other.

After the resultant structure having the plurality of word line trenches T2 is cleaned, the gate dielectric layer 116, the word line 118, and the buried insulating layer 120 may be sequentially formed in each of the plurality of word line trenches T2.

In some exemplary embodiments, after the plurality of word lines 118 are formed, impurity ions may be implanted into the substrate 110 at opposite sides of the plurality of word lines 118 to form a plurality of source/drain regions in upper surfaces of the plurality of active regions ACT. In some other exemplary embodiments, such an impurity ion implantation process may be performed to form the plurality of source/drain regions before the plurality of word lines 118 are formed. In some exemplary embodiments, the plurality of word lines 118 may include Ti, TiN, Ta, TaN, W, WN, TiSiN, WSiN, or a combination thereof.

The gate dielectric layer 116 may be formed of at least one selected from a silicon oxide layer, a silicon nitride layer, a silicon oxynitride layer, an oxide/nitride/oxide (ONO) layer, and a high-k dielectric layer having a higher dielectric constant than a silicon oxide layer. For example, the gate dielectric layer 116 may have a dielectric constant of about 10 to 25. In some exemplary embodiments, the gate dielectric layer 116 may be formed of $HfO_2$, $Al_2O_3$, $HfAlO_3$, $Ta_2O_3$, $TiO_2$, or a combination thereof. However, embodiments are not limited thereto.

The upper surfaces of the plurality of buried insulating layers 120 may be at substantially the same level as the upper surface of the substrate 100. The buried insulating layer 120 may be formed of a material layer selected from a silicon oxide layer, silicon nitride layer, a silicon oxynitride layer, or a combination thereof.

A first insulating layer 122 and a second insulating layer 124 may be sequentially formed on the substrate 110 and the buried insulating layer 120. The first insulating layer 122 and the second insulating layer 124 may be formed to cover the upper surfaces of the plurality of active regions ACT, the upper surfaces of the device isolation layers 112, and the upper surfaces of the plurality of buried insulating layers 120. The first insulating layer 122 and the second insulating layer 124 may each independently be formed of a silicon oxide layer, a silicon nitride layer, or a combination thereof. In some exemplary embodiments, the first insulating layer 122 may be formed of a silicon oxide layer, and the second insulating layer 124 may be formed of a silicon nitride layer.

Figure 3B:
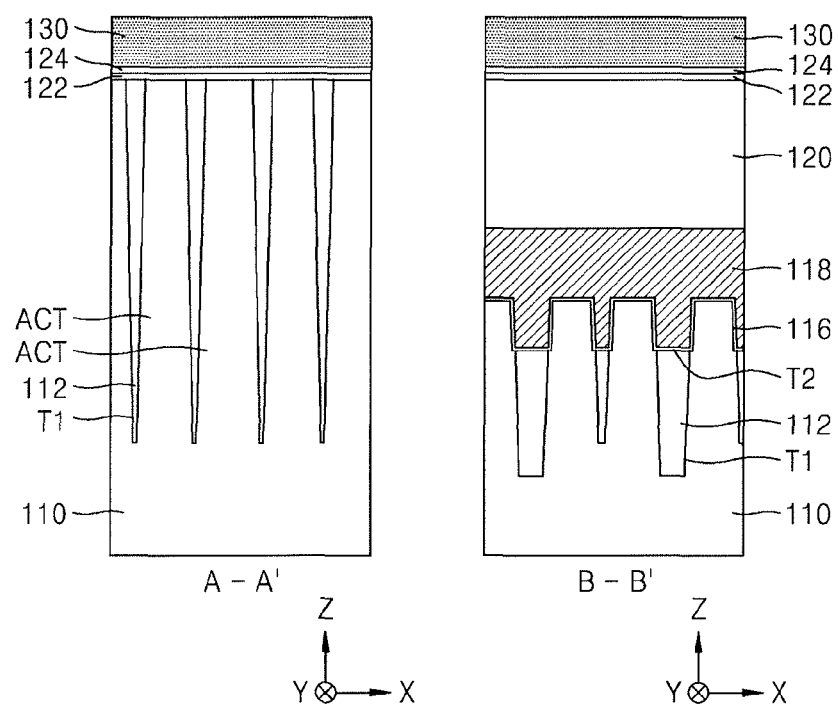

Referring to FIG. 3B, a first conductive layer 130 may be formed on the second insulating layer 124. The first conductive layer 130 may be formed of a doped polysilicon. However, embodiments are not limited thereto.

Figure 3C:
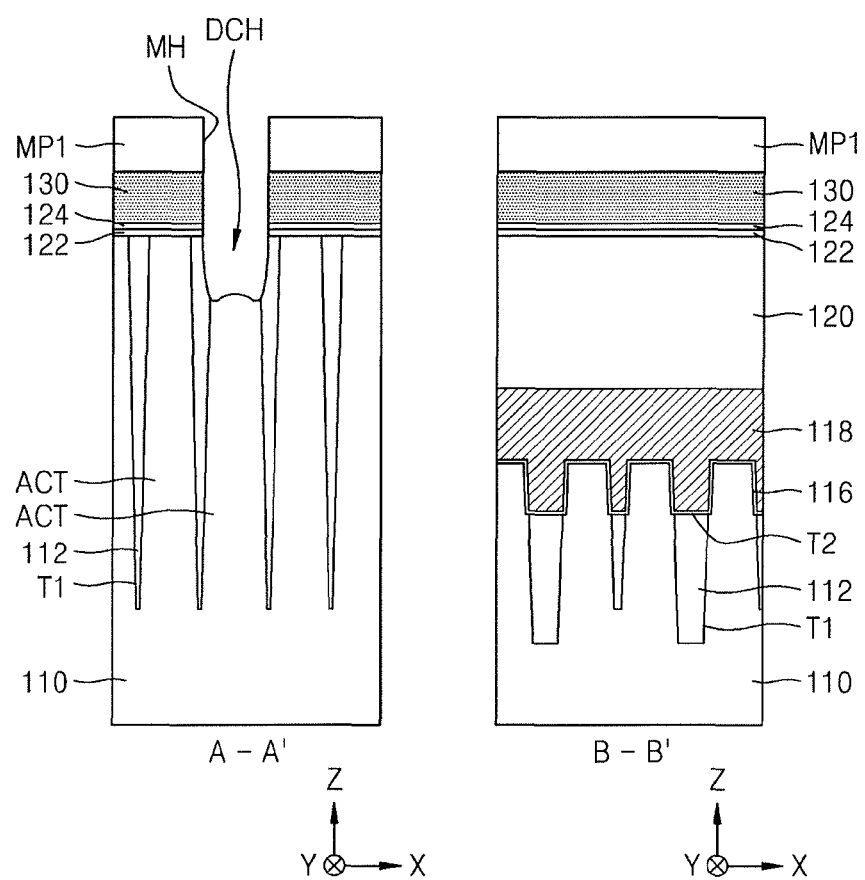

Referring to FIG. 3C, a mask pattern MP1 may be formed on the first conductive layer 130. Subsequently, a portion of the first conductive layer 130 exposed through an opening MH of the mask pattern MP1 may be etched to expose a portion of the substrate 110 and a portion of the device isolation layer 112. The exposed portions of the substrate 110 and the device isolation layer 112 may then be etched to form a direct contact hole DCH exposing the active region ACT in the substrate 110.

The mask pattern MP1 may be formed as a hard mask pattern including an oxide layer or a nitride layer. The mask pattern MP1 may be formed using a photolithography process.

Figure 3D:
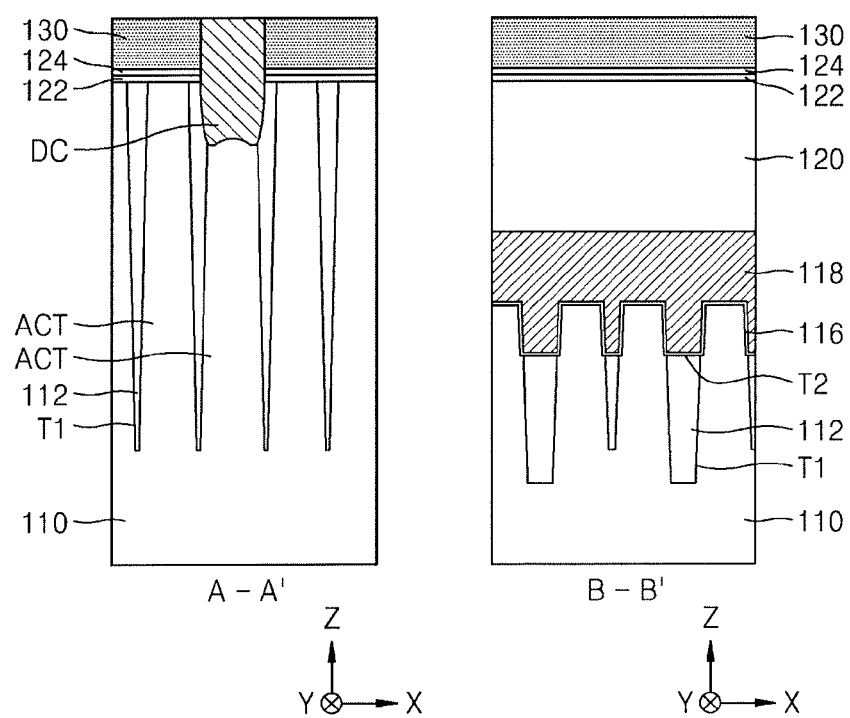

Referring to FIG. 3D, after the mask pattern MP1 (see FIG. 3C) is removed to expose the upper surface of the first conductive layer 130, a second conductive layer having a thickness sufficient to fill the direct contact hole DCH may be formed in the direct contact hole DCH and on the first conductive layer 130. Next, the second conductive layer may be etched back or otherwise planarized so that only the second conductive layer in the direct contact hole DCH remains, thereby forming a direct contact DC including a portion of the second conductive layer that remains in the direct contact hole DCH. The second conductive layer may be formed of a doped polysilicon. However, embodiments are not limited thereto.

Figure 3E:
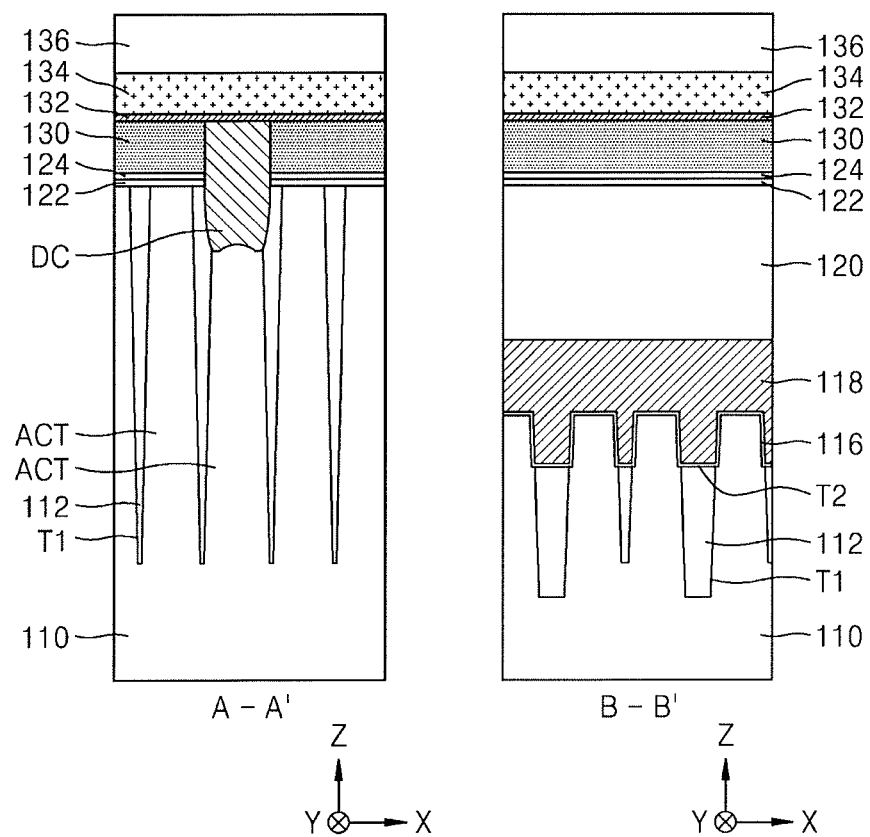

Referring to FIG. 3E, a third conductive layer 132, a fourth conductive layer 134, and a first capping layer 136 may be sequentially formed on the first conductive layer 130 and the direct contact DC. The third conductive layer 132 and the fourth conductive layer 134 may be each independently formed of TiN, TiSiN, W, tungsten silicide, or a combination thereof. However, embodiments are not limited thereto. In some exemplary embodiments, the third conductive layer 132 may include TiSiN, and the fourth conductive layer 134 may include W.

The first capping layer 136 may be formed as a single insulating layer or multiple insulting layers. The first capping layer 136 may be formed of a silicon nitride layer.

Figure 3F:
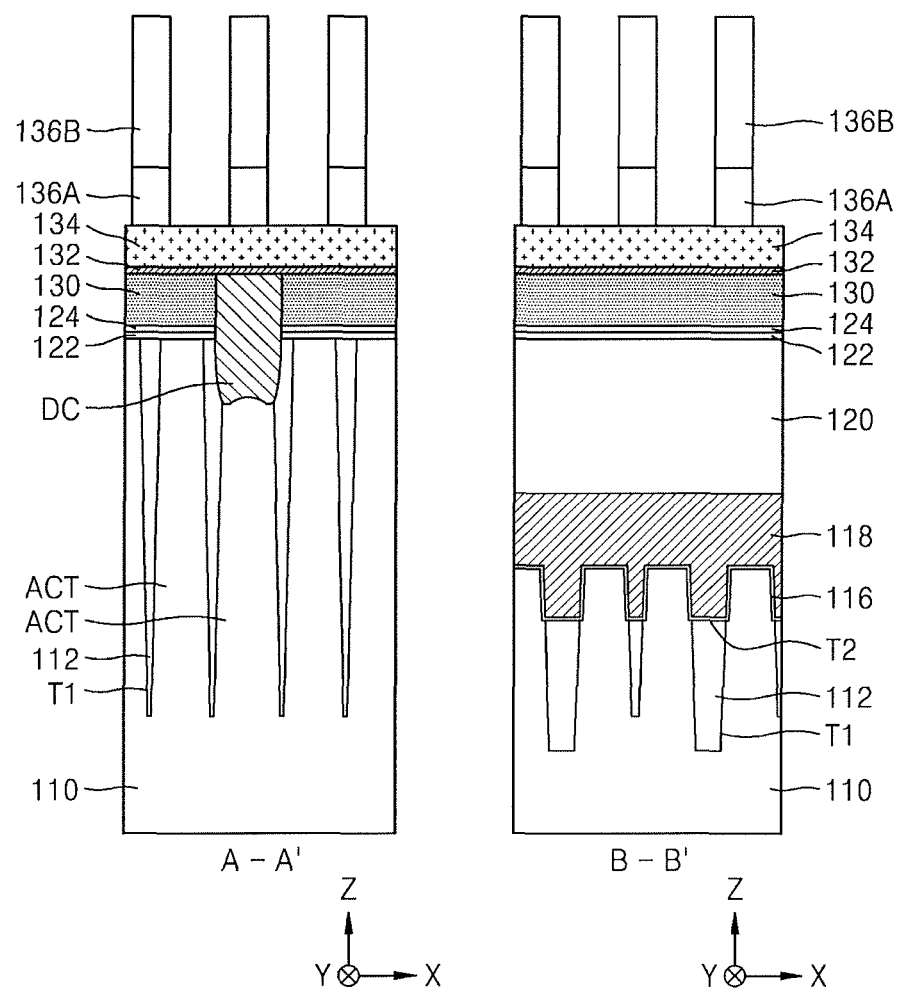

Referring to FIG. 3F, after a second capping layer is formed on the first capping layer 136 (see FIG. 3E), the second capping layer and the first capping layer 136 may be patterned using a photolithography process to form a first capping pattern 136A that is a remaining portion of the first capping layer 136, and a second capping pattern 136B that is a remaining portion of the second capping layer.

Figure 3G:
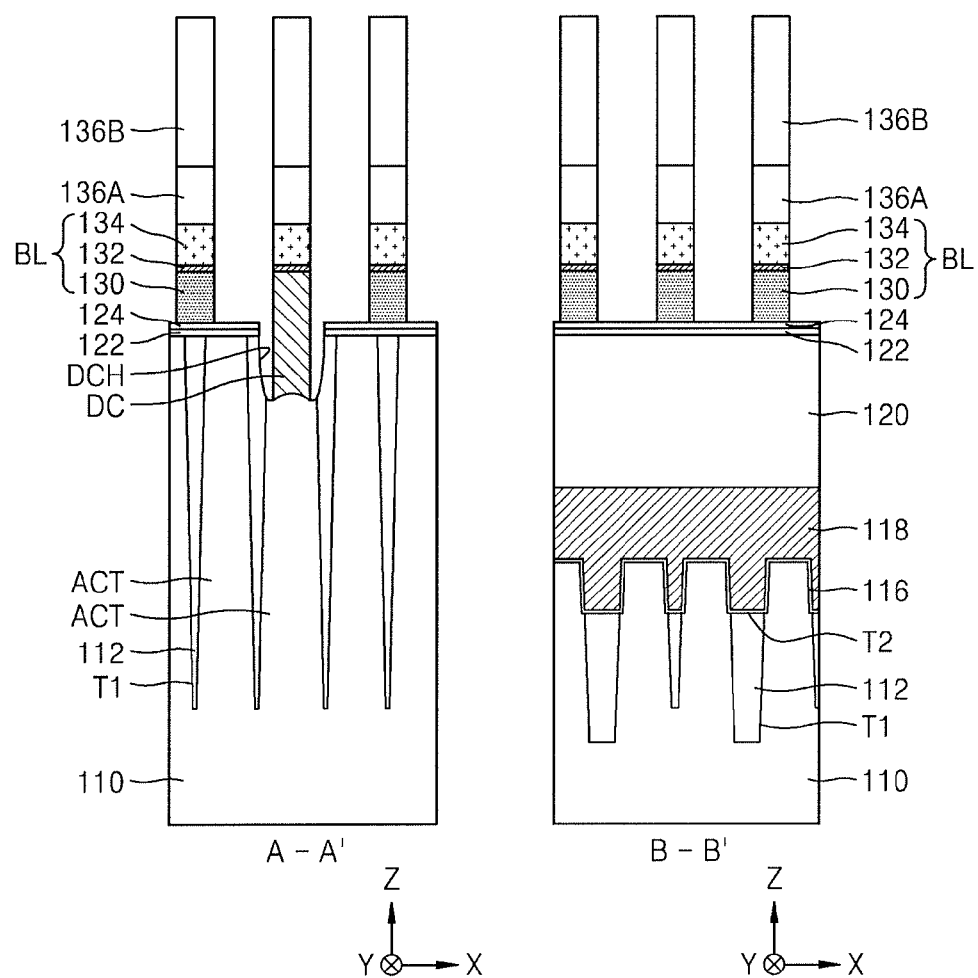

Referring to FIG. 3G, the fourth conductive layer 134, the third conductive layer 132, the first conductive layer 130, and the direct contact DC may be partially etched using the first and second capping patterns 136A and 136B as an etch mask to thereby form a plurality of bit lines BL on the substrate 110. A portion of the direct contact hole DCH around the direct contact DC may be exposed again after forming the plurality of bit lines BL.

Figure 3H:
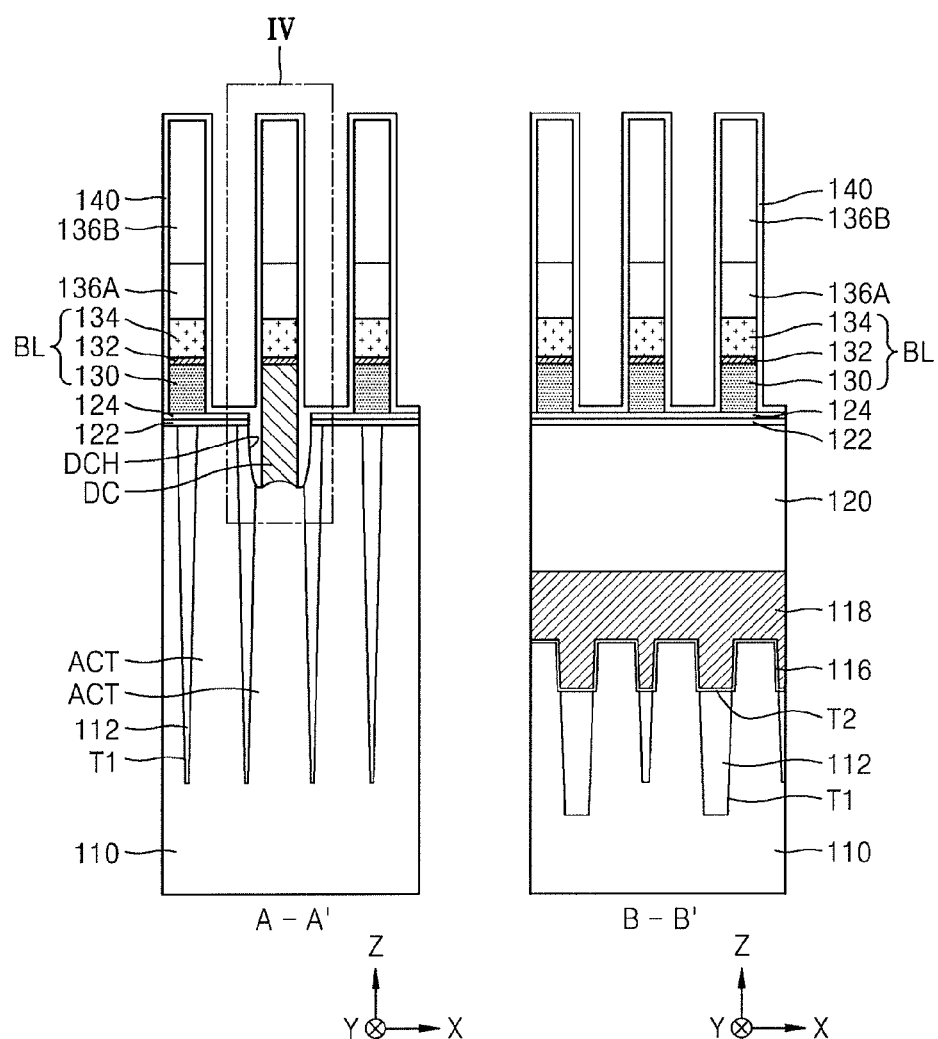

Referring to FIG. 3H, an insulating spacer layer 140 may be formed to fill in the direct contact hole DCH and cover the sidewalls of the plurality of bit lines BL, the exposed surfaces of the first and second capping patterns 136A and 136B, and the exposed surfaces of the direct contact DC.

The insulating spacer layer 140 may be formed of an oxide layer, a nitride layer, or a combination thereof. An exemplary method of forming the insulating spacer layer 140 will be described later with reference to FIGS. 4A to 4H, which are magnified views of a region "IV" denoted by a dot-and-dashed line in FIG. 3H.

Figure 3I:
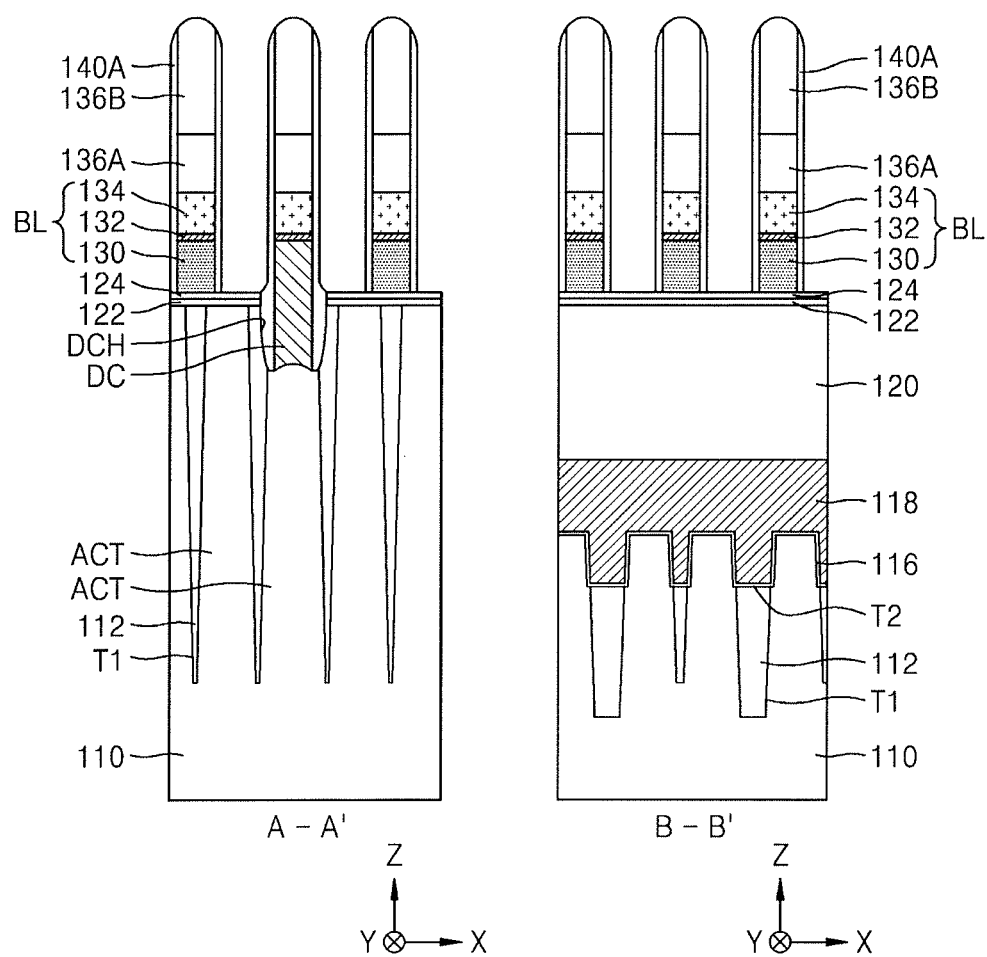

Referring to FIG. 3I, the insulating spacer layer 140 may be anisotropically etched to form a plurality of insulating spacers 140A that cover the opposite sidewalls of the first and second capping patterns 136A and 136B, the plurality of bit lines BL, and the direct contact DC.

Figure 3J:
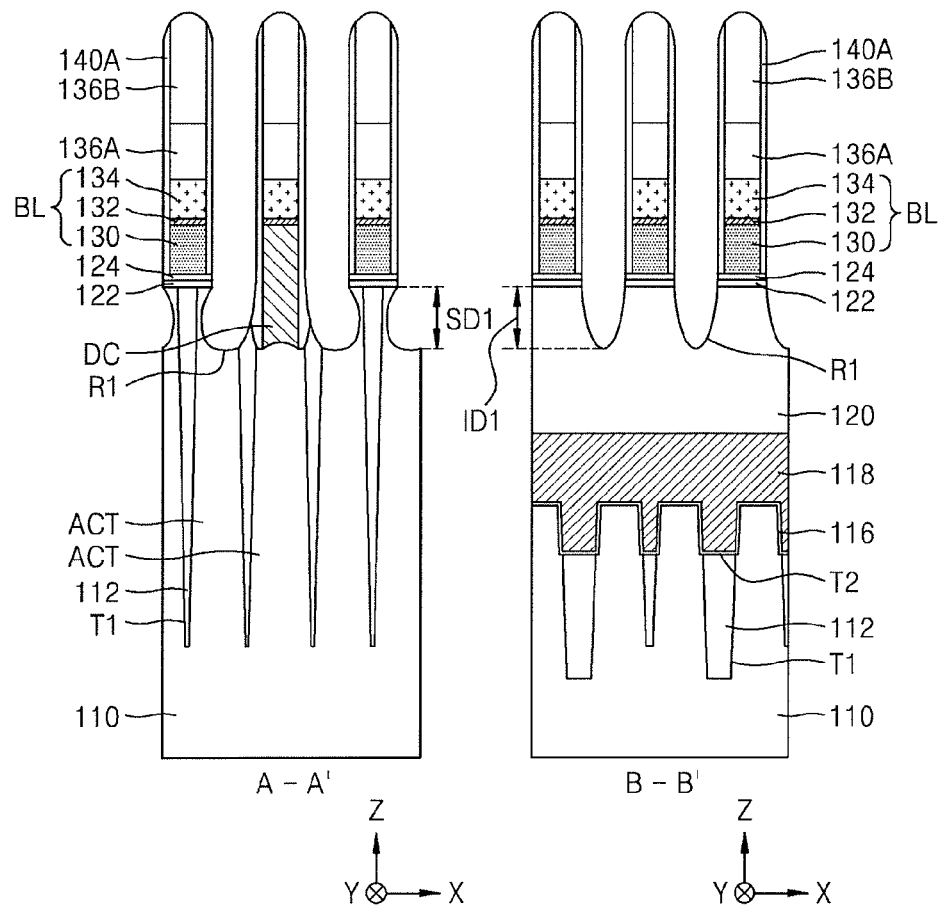

Referring to FIG. 3J, the anisotropic etching of the insulating spacer layer 140, as described with reference to FIG. 3I, may be continuously further performed to remove portions of structures exposed between the plurality of bit lines BL through the plurality of insulating spacers 140A, to thereby form a plurality of first recess spaces R1 that expose the active regions ACT of the substrate 100 between the plurality of bit lines BL.

In some exemplary embodiments, the plurality of first recess spaces R1 may be formed using anisotropic etching, isotropic etching, or a combination thereof. For example, the second insulating layer 124, the first insulating layer 122, and the plurality of buried insulating layers 120 among the structures exposed between the plurality of bit lines BL through the plurality of insulating spacers 140A may be sequentially etched by an anisotropic etching process, and then the active regions ACT of the substrate 100 exposed as a result of etching the first insulating layer 122 may be etched by an isotropic etching process until the plurality of first recess spaces R1 are obtained.

Portions of the plurality of first recess spaces R1 that are formed in the plurality of buried insulating layers 120 may have a first insulation depth ID1 along the Z direction from the upper surfaces of the plurality of buried insulating layers 120. Portions of the plurality of first recess spaces R1 that are formed in the substrate 110 may have a first substrate depth SD1 from the upper surface of the substrate 110.

Figure 3K:
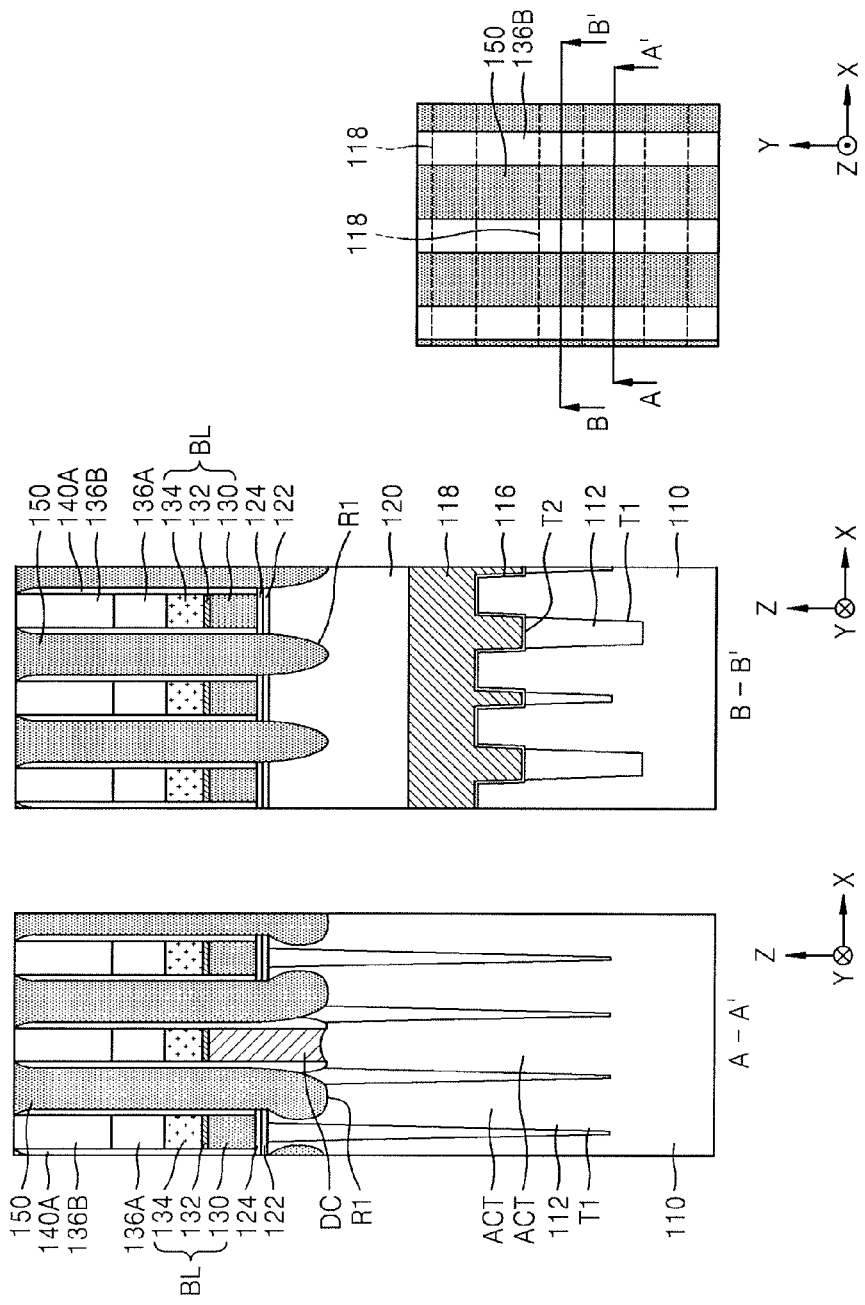

Referring to FIG. 3K, after forming a buried conductive layer 150 that fills the plurality of first recess spaces R1 exposed between the plurality of bit lines BL through the plurality of insulating spacers 140A, the spaces between the plurality of bit lines BL, and the spaces between the plurality of first and second capping patterns 136A and 136B, the resulting structure including the buried conductive layer 150 may be planarized to expose the upper surfaces of the plurality of second capping patterns 136B.

The buried conductive layer 150 may include a plurality of conductive line patterns that extend parallel to one another filling the spaces between the plurality of bit lines BL defined by the plurality of insulating spacers 140A. The plurality of conductive line patterns that constitute the buried conductive layer 150 may alternate with the plurality of bit lines BL and extend parallel to the plurality of bit lines BL.

The buried conductive layer 150 may be formed by chemical vapor deposition (CVD), physical vapor deposition (PVD), or an epitaxial growth process. The buried conductive layer 150 may be formed of a doped semiconductor material, a metal, a conductive metal nitride, a metal silicide, or a combination thereof. However, embodiments are not limited thereto.

In FIG. 3K, a plan view of some regions of the resulting structure from the planarization of the upper surface of the buried conductive layer 150 is also shown. In the plan view of FIG. 3K, the positions of the plurality of word lines 118 are denoted by dashed lines for ease of understanding.

Figure 3L:
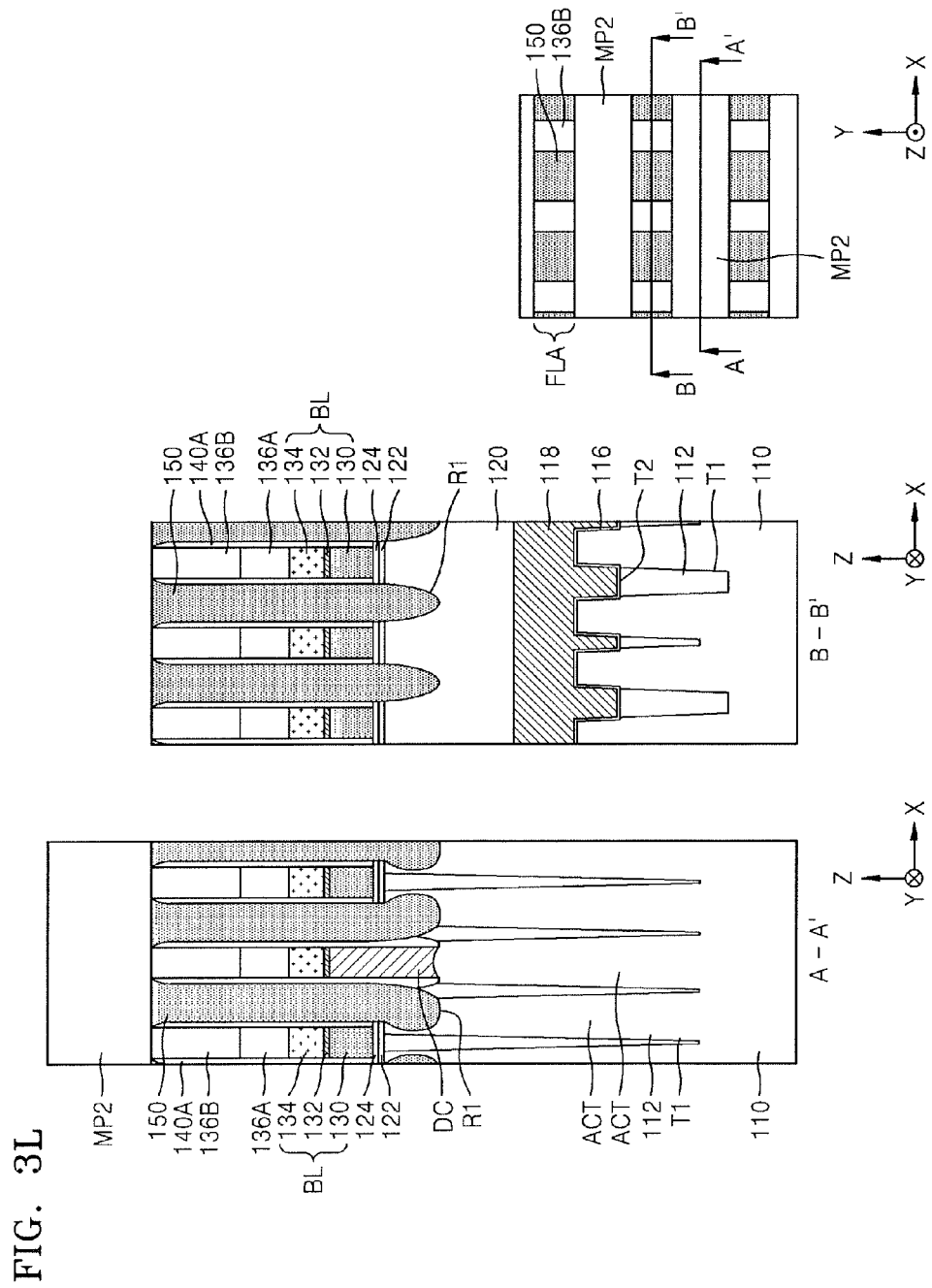

Referring to FIG. 3L, a plurality of mask patterns MP2 that cover portions of the upper surface of the buried conductive layer 150 may be formed on the planarized upper surfaces of the buried conductive layer 150 and the plurality of second capping layer 136B.

In FIG. 3L, a plan view of some regions of the resulting structure from the formation of the plurality of mask patterns MP2 is also shown. As illustrated in the plan view of FIG. 3L, the plurality of mask patterns MP2 may include a plurality of line patterns that extend parallel to one another in a direction that intersects the extending direction (Y direction) of the plurality of bit lines BL, for example, in a direction (X direction) orthogonal to the extending direction (Y direction) of the plurality of bit lines BL.

After forming the plurality of mask patterns MP2, portions of the buried conductive layer 150 that correspond to a plurality of fence line areas FLA may be exposed through the plurality of mask patterns MP2, the plurality of fence line areas FLA extending parallel to one another, separated from one another, in a direction (X direction) that intersects the extending direction (Y direction) of the plurality of bit lines BL.

The plurality of mask patterns MP2 may be formed of a material having a different etch selectivity from that of a material of the buried conductive layer 150. In some exemplary embodiments, the plurality of mask patterns MP2 may include an oxide layer, a nitride layer, a spin-on hardmask (SOH) material, or a combination thereof. In some exemplary embodiments, the SOH material may include a hydrocarbon compound having a relatively high carbon content of about 85 wt % to about 99 wt % based on a total weight of the SOH material, or a derivative of the hydrocarbon compound. However, the materials of the mask patterns MP2 according to embodiments are not limited thereto.

Figure 3M:
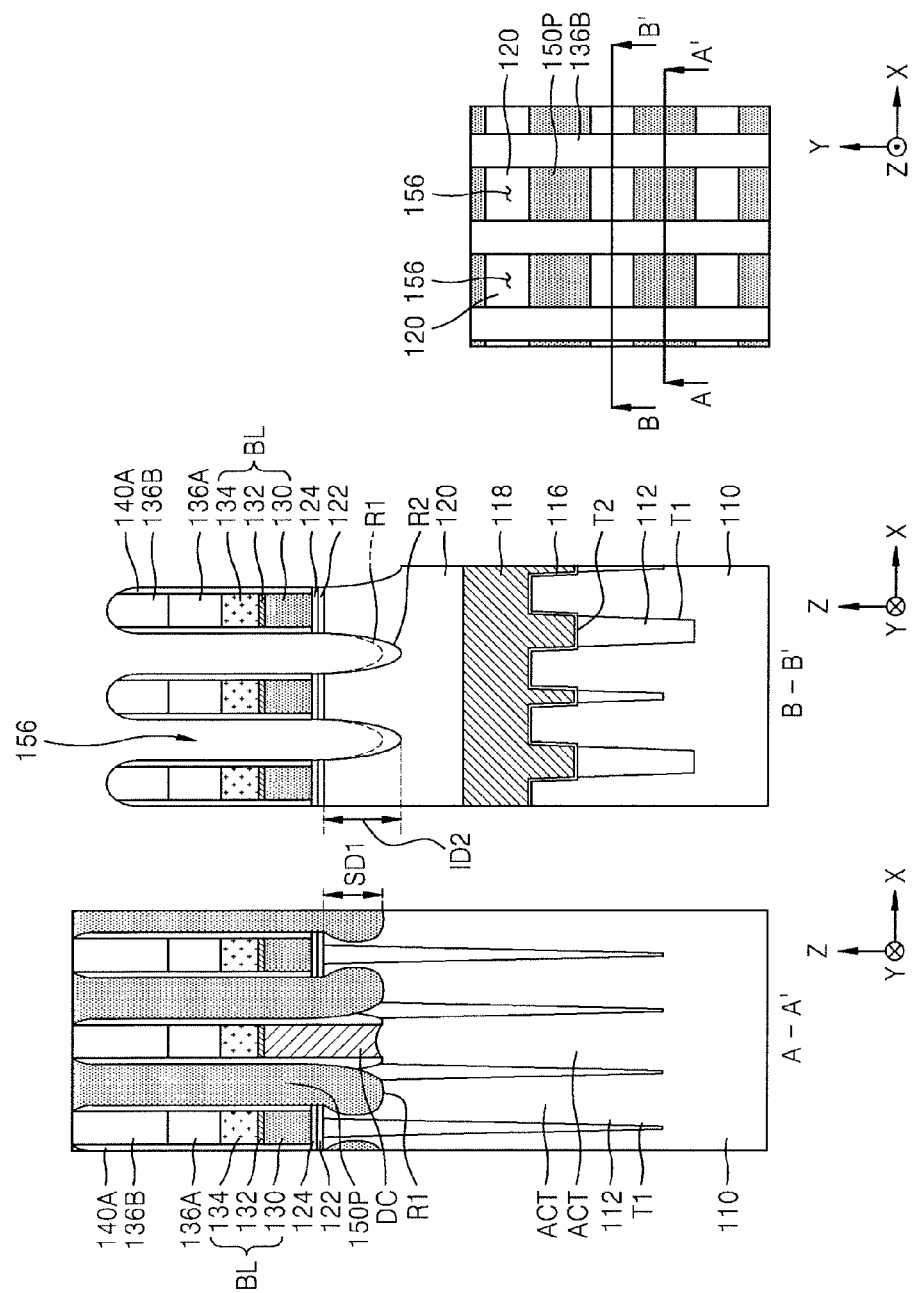

Referring to FIG. 3M, portions of the buried conductive layer 150 that are exposed through the plurality of mask patterns MP2 may be etched with the plurality of mask patterns MP2 (see FIG. 3L) and the second capping patterns 136B exposed through the plurality of mask patterns MP2 as an etch mask, to thereby separate the plurality of conductive line patterns of the buried conductive layer 150 as a plurality of contact plugs 150P and at the same time form a plurality of insulating fence spaces 156 that alternate with the separated plurality of contact plugs 150P. The sidewalls of the plurality of contact plugs 150P and the sidewalls of the plurality of insulating spacers 140A may be exposed through the vertical sidewalls of the plurality of insulating fence spaces 156.

Next, the plurality of mask patterns MP2 may be removed to expose the upper surfaces of the plurality of contact plugs 150P.

While the portions of the buried conductive layer 150 that are exposed through the plurality of mask patterns MP2 are etched, portions of the buried conductive layer 150 that vertically overlap with the substrate 100 may remain as the plurality of contact plugs 150P on the substrate 110. Portions of the buried conductive layer 150 that vertically overlap with the plurality of buried insulating layers 120 may be removed to provide the plurality of insulating fence spaces 156. That is, while the portions of the buried conductive layer 150 that are exposed through the plurality of mask patterns MP2 arc etched, the portions of the buried conductive layer 150 that vertically overlap with the plurality of word lines 118 may be removed to form the plurality of insulating fence spaces 156.

In some exemplary embodiments, as the buried conductive layer 150 is etched to form the plurality of insulating fence spaces 156, the plurality of buried insulating layers 120 under the plurality of first recess spaces R1 are exposed through the plurality of insulating fence spaces 156. Portions of The plurality of buried insulating layers 120 exposed through the plurality of insulating fence spaces 156 may be further etched to form a plurality of second recess spaces R2 having a second insulation depth ID2 from the upper surfaces of the plurality of buried insulating layers 120. The second insulation depth ID2 may be greater than the first insulation depth ID1 (see FIG. 3J) of the plurality of first recess spaces R1. Accordingly, the plurality of insulating fence spaces 156 may extend further to the plurality of second recess spaces R2 and become closer to the plurality of word lines 118 with a reduced vertical distance to the plurality of word lines 118.

The second insulation depth ID2 may be greater than the first substrate depth SD1 of the portions of the plurality of first recess spaces R1 that are formed in the substrate 110. Accordingly, a depth of the plurality of insulating fence spaces 156 may be greater than a depth of the plurality of contact plugs 150P.

In some other exemplary embodiments, in etching the buried conductive layer 150 to form the plurality of insulating fence spaces 156, the plurality of buried insulating layers 120 at the bottoms of the plurality of first recess spaces R1 may be set as an etch stop point. Consequentially, a bottom depth of the plurality of insulating fence spaces 156 may be at a substantially same or similar level as a bottom depth of the plurality of first recess spaces R1.

The etching of the buried conductive layer 150 and the etching of the plurality of buried insulating layers 120 to form the plurality of second recess spaces R2 may be performed by an anisotropic etching process.

The plurality of contact plugs 150P may be connected with the active regions ACT of the substrate 110, respectively. The plurality of contact plugs 150P may constitute buried contacts BC for electrically connecting the lower electrodes of capacitors on the plurality of contact plugs 150P to the active regions ACT of the substrate 100 in a subsequent process.

While the plurality of insulating fence spaces 156 are formed, the plurality of second capping patterns 136B and the plurality of insulating spacers 140A covering the opposite sidewalls of the second capping patterns 136B may be removed by a depth from the upper surfaces thereof and thus have reduced heights. Accordingly, the plurality of second capping patterns 136B may have a comparatively high-level upper surface portion as shown in a cross-sectional view taken along line A-A' in FIG. 3M, and a comparatively low-level upper surface portion as shown in a cross-sectional view taken along line B-B' in FIG. 3M. In the plurality of second capping patterns 136B, the comparatively high-level upper surface portions and the comparatively low-level upper surface portions may alternate in a same or similar repeat cycle in a lengthwise direction (Y direction) of the plurality of second capping patterns 136B. Accordingly, the plurality of second capping patterns 136B may be formed as a repeating step pattern with a same or similar step height along the lengthwise direction (Y direction) of the second capping patterns 236B.

Figure 3N:
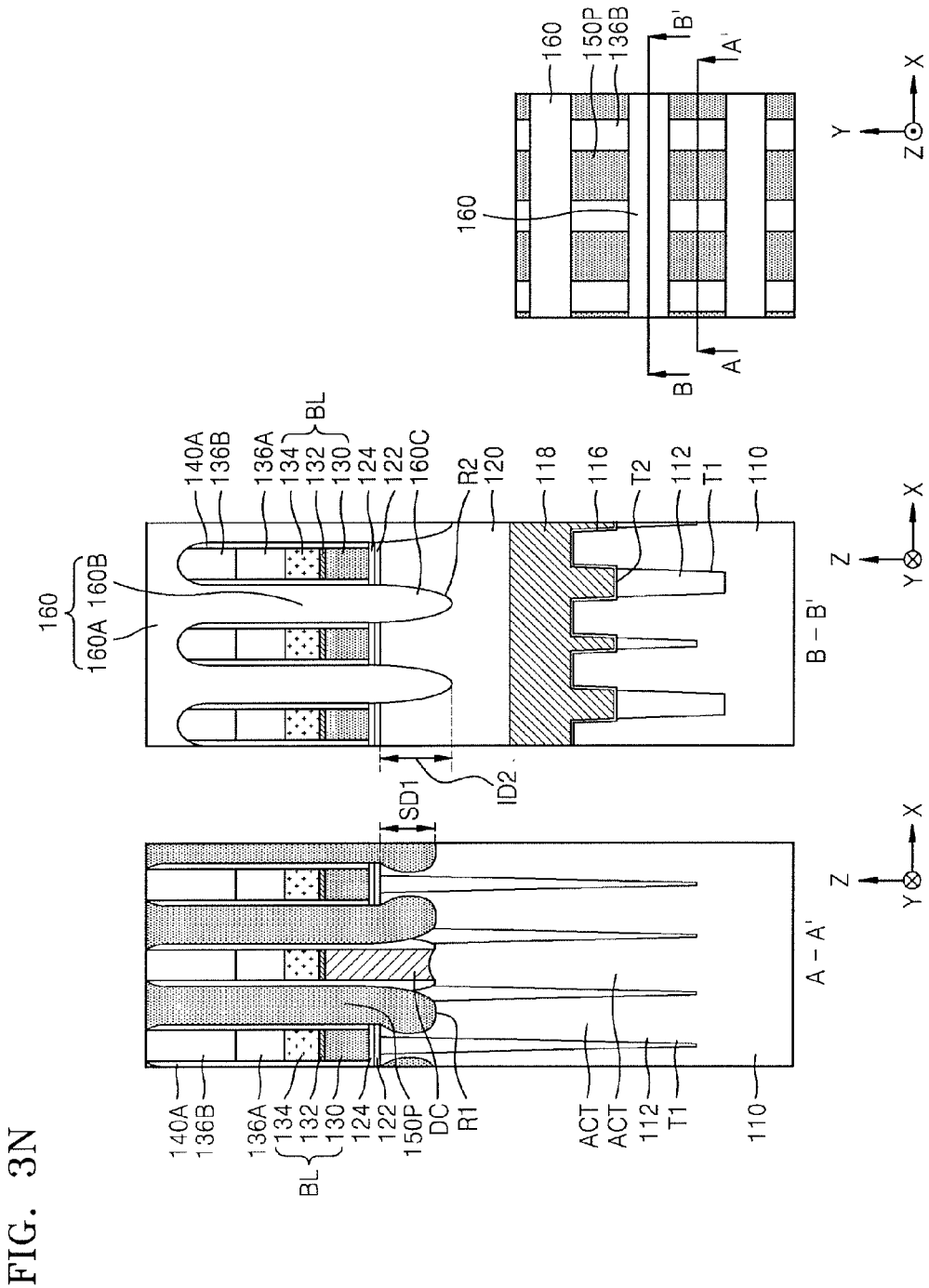
Figure 30:
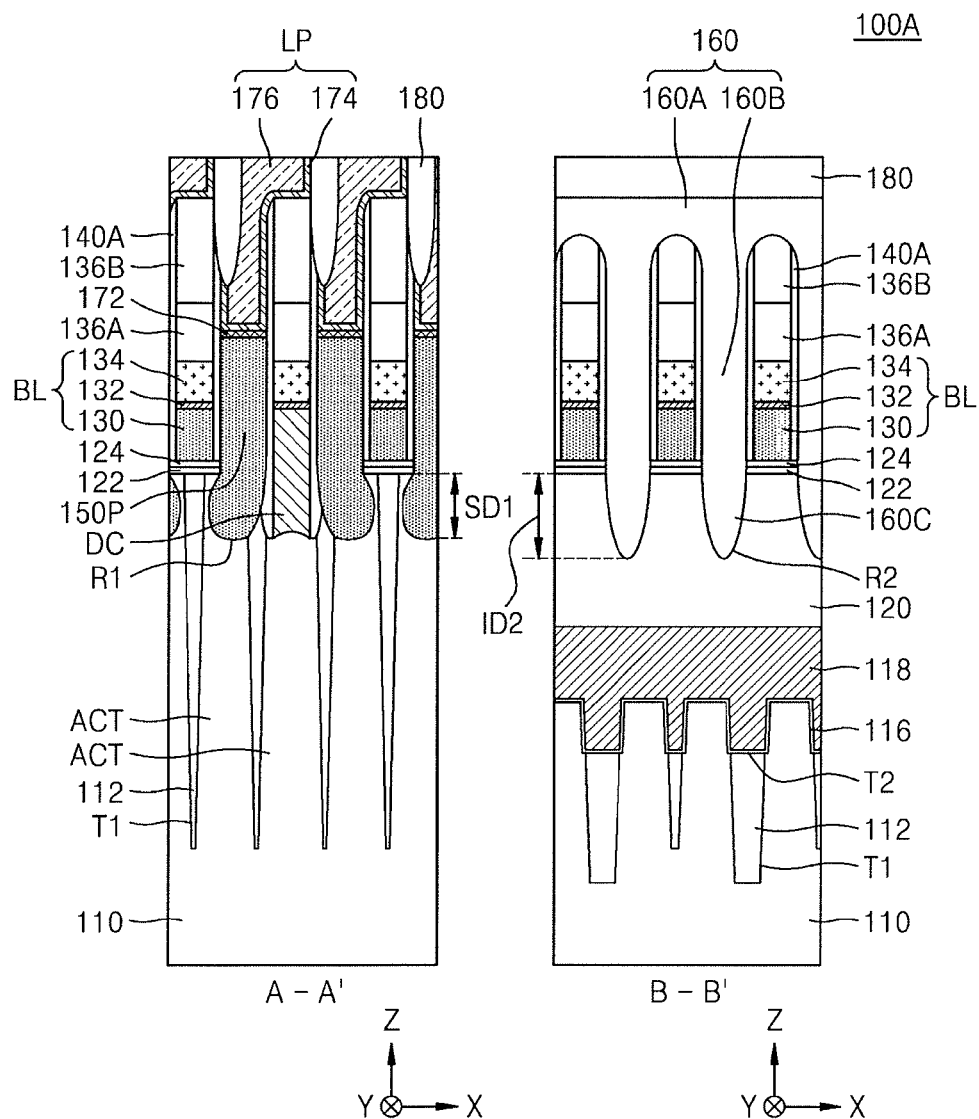

Referring to FIG. 3N, after an insulating layer having a thickness sufficient to fill the plurality of insulating fence spaces 156 is formed on the substrate 110, the insulating layer may be partially removed by an etch back or planarization process until the plurality of contact plugs 150P are exposed, thereby forming a plurality of insulating fences 160 that fill the plurality of insulating fence spaces 156 and cover the upper surfaces of the plurality of second capping patterns 136B.

The plurality of insulating fences 160 may include a plurality of insulating line patterns extending parallel to one another in a direction that intersects the extending direction (Y direction) of the plurality of bit lines BL, e.g., in a direction (X direction) orthogonal to the extending direction of the plurality of bit lines BL. Each of the plurality of insulating fences 160 may include one insulating line portion 160A that extends on, e.g., covers, the plurality of second capping patterns 136B in a direction that intersects the plurality of second capping patterns 136, and a plurality of insulating plug portions160B that extend from the insulating line portion 160A toward the substrate 110 and having end portions 160C, i.e., fill the plurality of insulating fence spaces 156 (see FIG. 3M). The one insulating line portion 160A and the plurality of insulating plug portion 160B may be integrally formed with one another at the same time.

The plurality of insulating line portions 160A of the plurality of insulating fences 160 may vertically overlap with plurality of word lines 118 and extend parallel to the plurality of word lines 118. The plurality of insulating plug portions 160B may extend from each of the plurality of insulating line portions 160A and extend between the plurality of insulating line portions 160A and the plurality of word lines 118 in a vertical direction toward the substrate 110.

Opposite sidewalls of the insulating line portion 160A may face the plurality of contact plugs 150P. The upper surfaces of the insulating line portions 160A and the upper surfaces of the plurality of contact plugs 150P may extend on the same plane.

Opposite sidewalls of each of the plurality of insulating plug portions 160B in the X direction may face a pair of bit lines BL, and opposite sidewalls of each of the plurality of insulating plug portions 160B in the Y direction may face a pair of contact plugs 150P. The end portions 160C of the plurality of insulating plug portions 160B may be buried in the buried insulating layer 120 covering the word lines 118. A vertical direction (Z direction) length ID2 of the end portions 160C of the plurality of insulating plug portions 160B that are buried in the buried insulating layer 120 may be greater than a vertical direction (Z direction) length SD1 of portions of the plurality of contact plugs 150P that are buried in the substrate 110. Accordingly, a vertical direction (Z direction) length of the plurality of insulating fences 160 may be greater than a vertical direction (Z direction) length of the plurality of contact plugs 150P. The plurality of insulating fences 160 may be formed of a silicon nitride layer. However, embodiments are not limited thereto.

Referring to FIG. 3O, after the plurality of contact plugs 150P are removed by a depth from the upper surfaces thereof to form a plurality of holes between the plurality of first and second capping patterns 136A and 136B, a metal silicide layer 172 may be formed on the upper surfaces of the plurality of contact plugs 150 exposed through the plurality of holes, and a plurality of conductive landing pads LP may be formed on the metal silicide layers 172 to fill the plurality of holes and be connected to the plurality of contact plugs 150P through the metal silicide layers 172.

In some exemplary embodiments, the metal silicide layer 172 may be formed of a cobalt silicide, a nickel silicide, or a manganese silicide. However, embodiments are not limited thereto. In some exemplary embodiments, the metal silicide layer 172 may be omitted.

The plurality of conductive landing pads LP may fill in the plurality of holes on the metal silicide layers 172 to extend to the upper surfaces of the plurality of first and second capping patterns 136A and 136B and vertically overlap, i.e., along the Z direction, with some of the plurality of bit lines BL. Each of the plurality of conductive landing pads LP may include a conductive barrier layer 174 and a conductive layer 176 that fills the space of each of the holes on the conductive barrier layer 174 and extends to the upper surface of the second capping pattern 136B, e.g., starts below the upper surface of the first capping pattern 136A and ends above and extends along the X direction over the second capping pattern 136B.

In some exemplary embodiments, the conductive barrier layer 174 may have a Ti/TiN stack structure. The conductive layer 176 may be formed of a doped polysilicon, a metal, a metal silicide, a conductive metal nitride, or a combination thereof. The conductive layer 176 may be formed of a metal, a metal nitride, a conductive polysilicon, or a combination thereof. For example, the conductive layer 176 may include tungsten (W).

Next, after forming a mask pattern on the conductive layer 176, portions of the conductive barrier layer 174, portions of the conductive layer 176, and neighboring insulating layers may be etched with the mask pattern as an etch mask to thereby form a plurality of conductive landing pads LP including the remaining portions of the conductive barrier layer 174 and the conductive layer 176. The mask pattern may be formed of a silicon nitride layer. However, embodiments are not limited thereto. The plurality of conductive landing pads LP may have a shape of a plurality of island patterns.

The plurality of conductive landing pads LP may be electrically insulated from one another by filling spaces around the plurality of conductive landing pads LP with the insulating layer 180.

Next, a plurality of capacitor lower electrodes that may be electrically connected with the plurality of conductive landing pads LP may be formed on the insulating layer 180.

In the methods of manufacturing an IC device, according to exemplary embodiments, described above with reference to FIGS. 3A to 3O, to form a plurality of contact plugs 150P, which are for electrically connecting capacitor lower electrodes with the active regions ACT of the substrate 110, between each of the plurality of bit lines BL, an etching process for forming a line pattern may be used, not an etching process for forming an island pattern. Unlike when using an etching process for forming an island pattern, it may be possible to prevent deterioration caused by etch depth variations at different positions of the substrate 110. Due to simplified manufacturing processes, the process time and costs may be reduced.

FIGS. 4A to 4H are cross-sectional views illustrating exemplary processes of forming the insulating spacer layer 140, according to exemplary embodiments. FIGS. 4A to 4H are magnified views of a region "IV" denoted by a dot-and-dashed line in FIG. 3H.

Figure 4A:
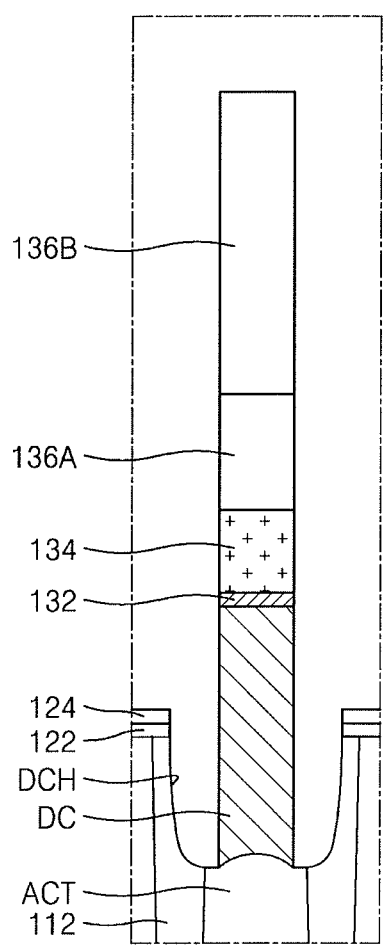
FIGS. 4A to 4H illustrate cross-sectional views of stages in forming an insulating spacer layer in a method of manufacturing an IC device, according to exemplary embodiments.

Referring to FIG. 4A, a plurality of bit lines BL may be formed, and a portion of the direct contact hole DCH around the direct contact DC may be exposed as described above with reference to FIG. 3G.

Figure 4B:
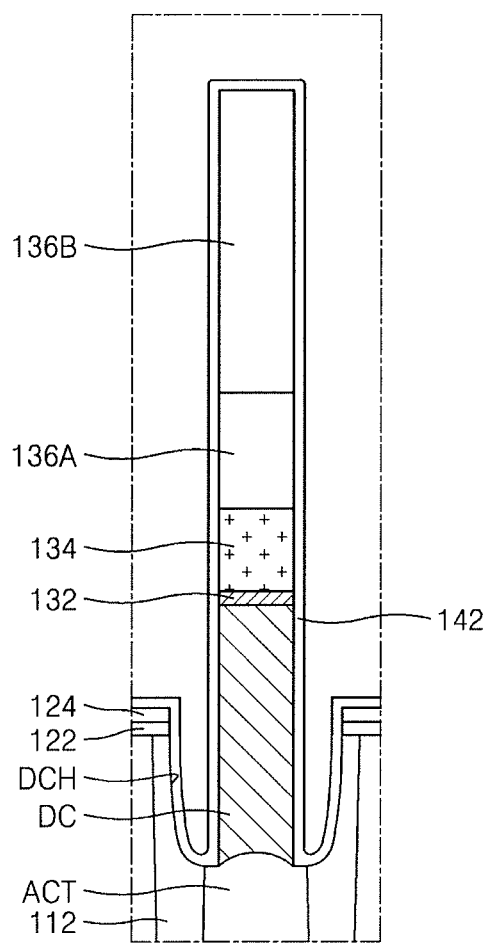

Referring to FIG. 4B, an insulating liner 142 that conformally covers the opposite sidewalls of the plurality of bit lines BL, the exposed surfaces of the first and second capping patterns 136A and 136B, and the exposed surfaces of the direct contact DC, and the inner wall of the direct contact hole DCH may be formed. The insulating liner 142 may be formed of a silicon nitride layer.

Figure 4C:
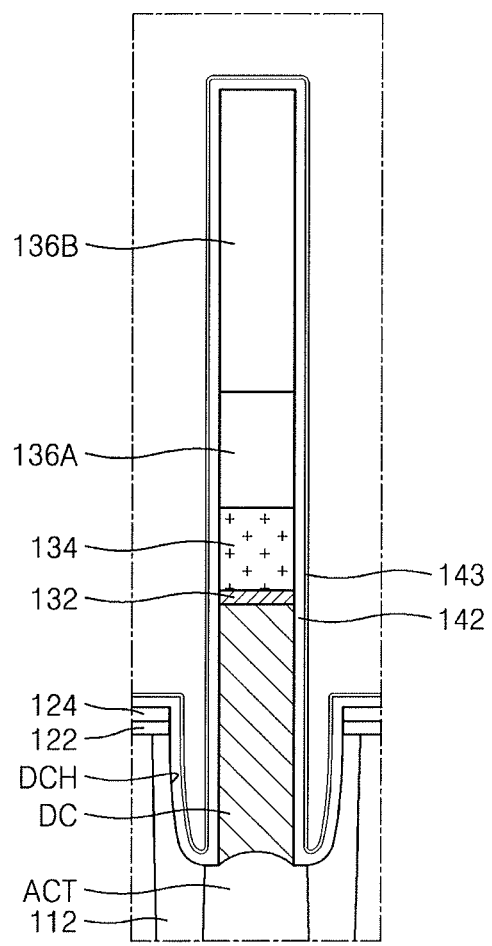

Referring to FIG. 4C, an inner spacer layer 143 may be conformally formed on the insulating liner 142. The inner spacer layer 143 may be formed of a material having a different etch selectivity from that of the insulating liner 142. For example, the inner spacer layer 143 may be formed of a silicon oxide layer. The inner spacer layer 143 may be formed to have a smaller thickness than the insulating liner 142.

Figure 4D:
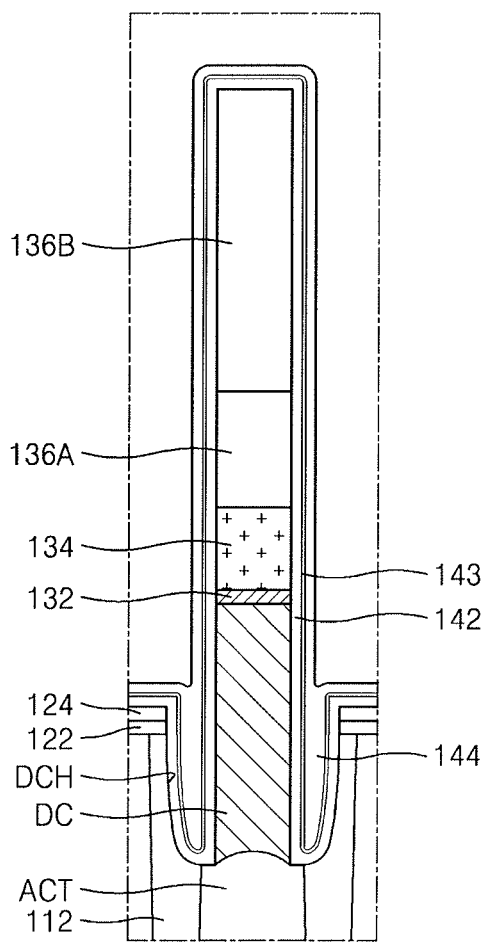

Referring to FIG. 4D, a disposal spacer layer 144 may be conformally formed on the inner spacer layer 143. The disposal spacer layer 144 may be formed to fill in the remaining space in the direct contact hole DCH. The disposal spacer layer 144 may be formed of a material having a different etch selectivity from that of the inner spacer layer 143. For example, the disposal spacer layer 144 may be formed of a silicon nitride layer.

Figure 4E:
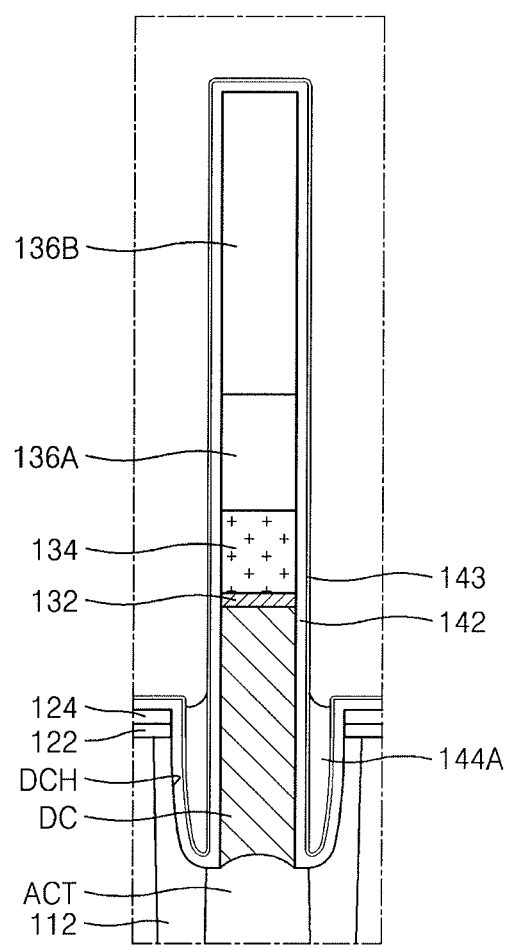

Referring to FIG. 4E, the disposal spacer layer 144 (see FIG. 4D) may be isotropically etched to form a disposal spacer 144A as the remaining portion of the disposal spacer layer 144. The disposal spacer 144A may include a portion of the disposal spacer layer 144 filling the direct contact hole DCH and a portion of the disposal spacer layer 144 covering the inlet of the direct contact hole DCH to block the direct contact hole DCH from outside.

In some exemplary embodiments, the isotropic etching process may be performed using phosphoric acid. During the isotropic etching process, the inner spacer layer 143 may serve as an etch stop layer.

Figure 4F:
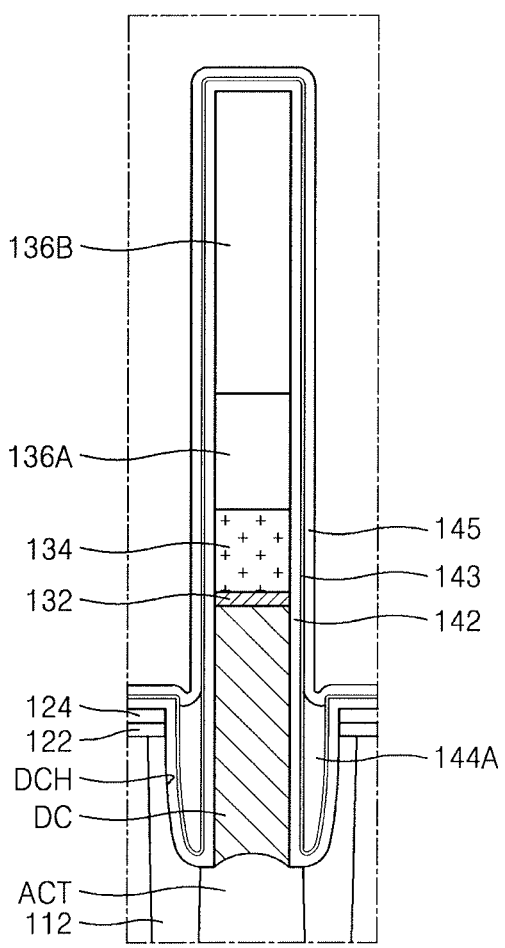

Referring to FIG. 4F, a middle spacer layer 145 that may conformally cover the exposed surfaces of the inner spacer layer 143 and the disposal spacer 144A may be formed. The middle spacer layer 145 may be formed of a material having a different etch selectivity from that of the disposal spacer 144A. For example, the middle spacer layer 145 may be formed of a silicon oxide layer.

Figure 4G:
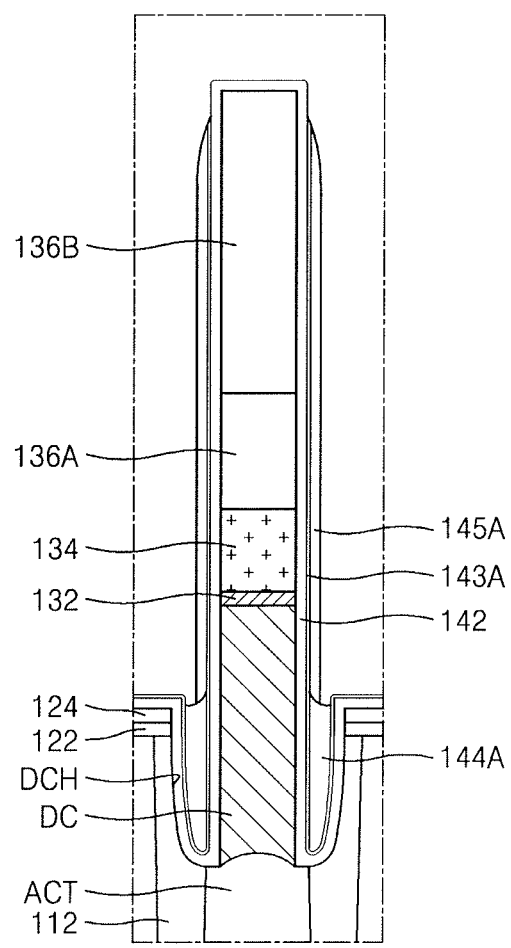

Referring to FIG. 4G, portions of the middle spacer layer 145 and the inner spacer layer 143 may be removed using an anisotropic etching process to thereby expose a portion of the insulating liner 142 covering the second capping pattern 136B and, at the same time, form an inner spacer 143A and a middle spacer 145A that consequently cover the insulating liner 142 on the opposite sidewalls of each of the plurality of bit lines BL. A portion of the disposal spacer 144A may be exposed again after forming the inner spacer 143A and the middle spacer 145A.

Figure 4H:
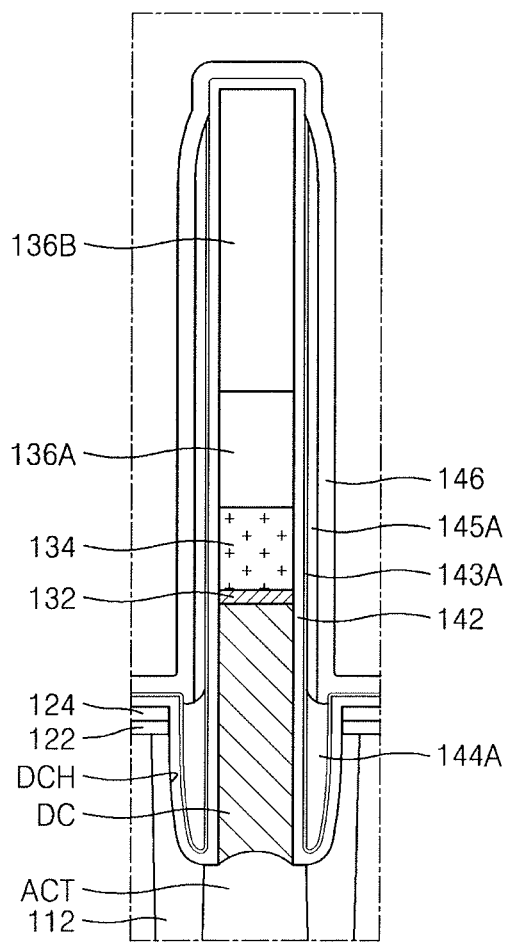

Referring to FIG. 4H, an outer spacer layer 146 that conformally covers the resulting structure having the inner spacer 143A and the middle spacer 145A may be formed. In some exemplary embodiments, the outer spacer layer 146 may be formed of a silicon nitride layer.

The insulating liner 142, the inner spacer 143A, the disposal spacer 144A, the middle spacer 145A, and the outer spacer layer 146 obtained using the methods described above with reference to FIGS. 4A to 4H may constitute the insulating spacer layer 140 illustrated as an embodiment in FIG. 3H. However, structures and formation methods of the insulating spacer layer 140 are not limited to those described above with reference to FIGS. 4A to 4H, which may allow various changes and embodiments that do not depart from the spirit and technical scope of the present disclosure.

Figure 5A:
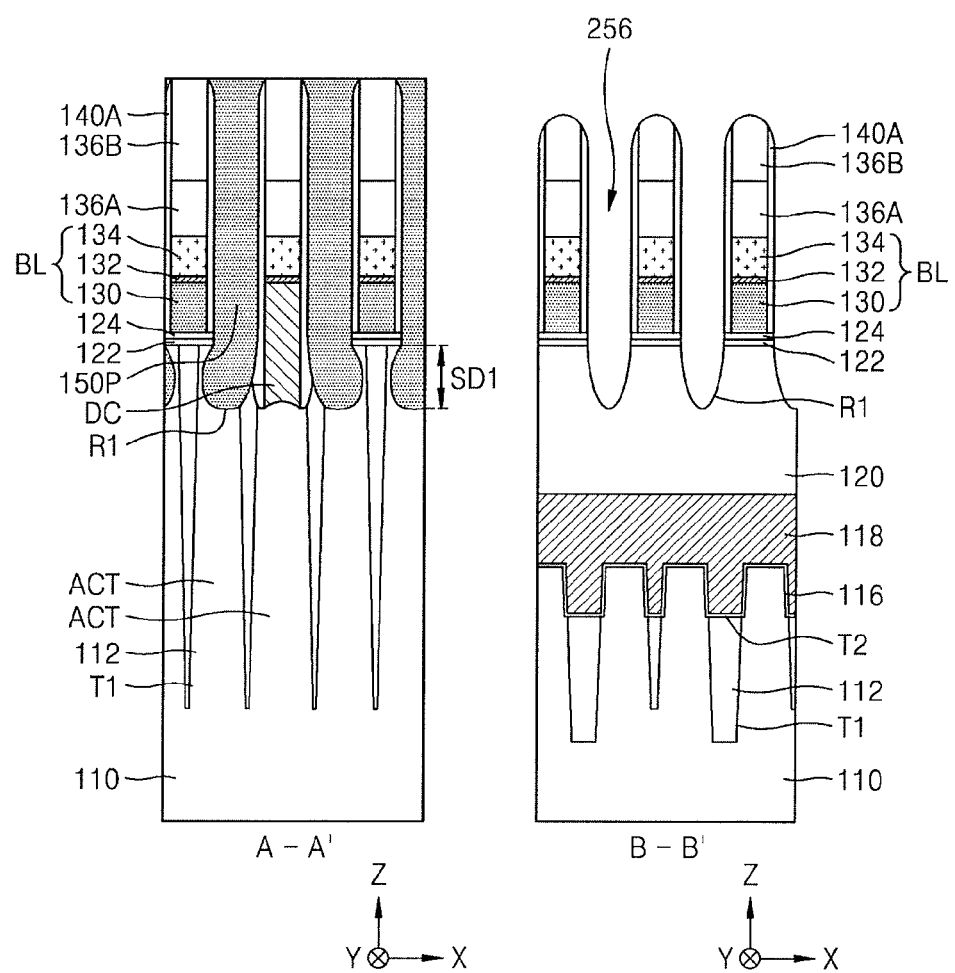
FIGS. 5A and 5B illustrate cross-sectional views of sequential stages of a method of manufacturing an IC device, according to exemplary embodiments.
Figure 5B:
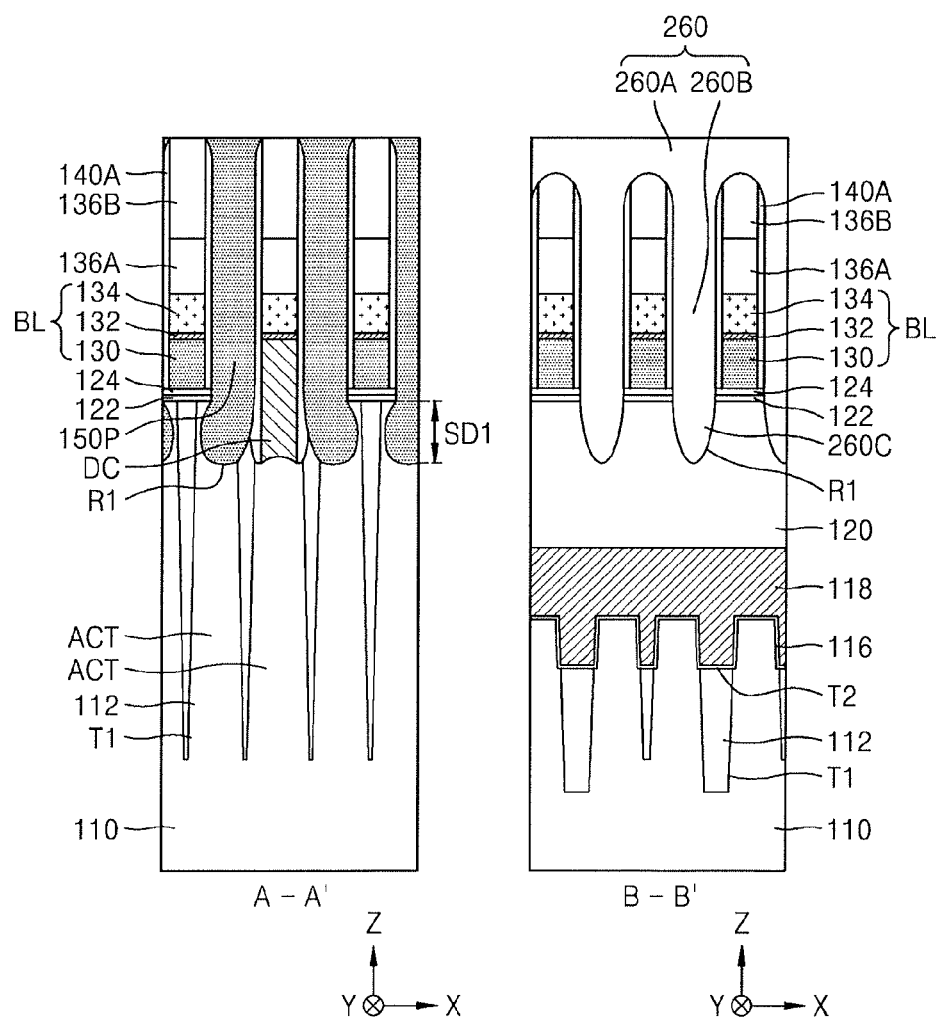

FIGS. 5A and 5B are cross-sectional views illustrating sequential stages of a method of manufacturing an IC device, according to exemplary embodiments. In FIGS. 5A and 5B, like reference numerals as those used in FIGS. 1 to 3O denote like elements and, thus, redundant description thereof will be omitted.

Referring to FIG. 5A, similar processes as those described above with reference to FIGS. 3A to 3D may be performed. Unlike as described in the previous embodiments, to form a plurality of contact plugs 150P, exposed portions of the buried conductive layer 150 may be etched with the plurality of mask patterns MP2 (see FIG. 3L) and the second capping patterns 136B, exposed through the plurality of mask patterns MP2, as an etch mask to thereby form a plurality of insulating fence spaces 256.

To form the plurality of insulating fence spaces 256, the buried conductive layer 150 may be etched until the plurality of buried insulating layers 120 at the bottom of the plurality of first recess spacers R1 are exposed. When etching the buried conductive layer 150, the point of time at which the plurality of buried insulating layers 120 at the bottom of the plurality of first recess spaces R1 are exposed may be set as an etch stop point. Consequentially, a bottom depth of the plurality of insulating fence spaces 256 may be substantially the same or similar to a bottom depth of the plurality of first recess spaces R1. A depth of the plurality of insulating fence spaces 256 may be substantially the same or similar to a depth of the plurality of contact plugs 150P.

Referring to FIG. 5B, after an insulating layer (not shown) having a thickness sufficient to fill the plurality of insulating fence spaces 256 (see FIG. 5A) is formed on the substrate 110 in the same manner as described above with reference to FIG. 3N, the insulating layer may be partially removed until the plurality of contact plugs 150P are exposed, thereby forming a plurality of insulating fences 260 that fill the plurality of insulating fence spaces 256 and cover the upper surfaces of the plurality of second capping patterns 136B.

Each of the plurality of insulating fences 260 may include one insulating line portion 260A that extends on the plurality of second capping patterns 136B in a direction that intersects the plurality of second capping patterns 136B, and a plurality of insulating plug portions 260B that extend from the insulating line portion 260A toward the substrate 110 and fill in the plurality of insulating fence spaces 256 (see FIG. 5A). Opposite sidewalls of the insulating line portion 260A may face (a pair of contact plugs of the plurality of contact plugs 150P. Opposite sidewalls of each of the plurality of insulating plug portions 260B in the X direction may face a pair of bit lines BL, and opposite sidewalls of each of the plurality of insulating plug portions 260B in the Y direction may face a pair of contact plugs 150P. End portions 160C of the plurality of insulating plug portions 160B may be buried in the buried insulating layers 120 covering the word lines 118. A vertical direction (Z direction) length of the end portions 260C of the plurality of insulating plug portions 260B that are buried in the buried insulating layer 120 may be substantially the same or similar to a vertical direction (Z direction) length SD1 of portions of the plurality of contact plugs 150P that are buried in the substrate 110.

Details of the plurality of insulating fences 260 may be mostly the same as the plurality of insulating fences 160 described above with reference to FIG. 3N, and thus will not be provided here.

Next, in a similar manner as described above with reference to FIG. 3O, after the plurality of contact plugs 150P are removed by a depth from the upper surfaces thereof to form a plurality of holes between the plurality of first and second capping patterns 136A and 136B, a plurality of metal silicide layers 172 and then a plurality of conductive landing pads LP may be sequentially formed on the plurality of contact plugs 150P exposed through the plurality of holes.

In the methods of manufacturing an IC device, according to exemplary embodiments of, described above with reference to FIGS. 5A and 5B, similar to as described above with reference to FIGS. 3A to 3O, to form a plurality of contact plugs 150P, which are for electrically connecting capacitor lower electrodes with the active regions ACT of the substrate 110, alternately with a plurality of bit lines BL, an etching process for forming a line pattern may be used, instead of an etching process for forming an island pattern. Thus, it may be possible to prevent deterioration caused by etch depth variations at different positions of the substrate 110. Due to simplified manufacturing processes, the process time and costs may be reduced.

As described above, according to the one or more embodiments, a method of manufacturing an integrated device may use an etching process for forming a line pattern, not for forming an island pattern, to form a plurality of contact plugs. Accordingly, unlike when using an etching process for forming an island pattern to form a plurality of contact plugs, it may be possible to prevent deterioration caused by etch depth variations at different positions of the substrate. The manufacturing process may be simplified, the process time and costs may be reduced, and the reliability of the IC device may also be improved.

Embodiments provide a method of manufacturing an integrated circuit (IC) device, the method using a simplified process to form a plurality of contact plugs adjacent to one another, thereby reducing the level of processing difficulty and a unit process cost, and improving the reliability of the IC device due to reduced process variations.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an integrated circuit device, the method comprising:
   forming a plurality of multilayered stack structures that extend parallel to and separated from one another on a substrate;
   forming a buried conductive layer including a plurality of conductive line patterns that extend parallel to an extending direction of the multilayered stack structures, each of the plurality of conductive line patterns being between each of the multilayered stack structures;
   removing portions of the buried conductive layer that correspond to a plurality of fence line areas which are spaced apart from one another and extend parallel to one another in a direction crossing the extending direction of the multilayered stack structures, to thereby separate the plurality of line patterns of the buried conductive layer from one another as a plurality of contact plugs and, at the same time, form a plurality of insulating fence spaces that alternate with the plurality of contact plugs in the extending direction of the multilayered stack structures; and
   forming a plurality of insulating fences that include a plurality of insulating line patterns filling the plurality of insulating fence spaces and extending parallel to one another along the plurality of fence line areas.

2. The method as claimed in claim 1, wherein each of the multilayered stack structures includes a conductive line, a capping layer covering the conductive line, and insulating spacers covering opposite sidewalls of the conductive line and opposite sidewalls of the capping layer, and
   forming the buried conductive layer includes filling spaces defined between the multilayered stack structures by the insulating spacers.

3. The method as claimed in claim 1, further comprising, before forming the buried conductive layer:
   exposing portions of the substrate between the multilayered stack structures;
   etching the exposed portions of the substrate between the multilayered stack structures to form a plurality of first recess spaces in the substrate, the plurality of first recess spaces having a first substrate depth from an upper surface of the substrate; and
   forming the buried conductive layer includes filling the plurality of first recess spaces.

4. The method as claimed in claim 1, further comprising:
   forming a plurality of word lines that are buried in the substrate, and a plurality of buried insulating layers covering the plurality of word lines, before forming the multilayered stack structures; and before forming the buried conductive layer, exposing portions of the substrate and portions of the plurality of buried insulating layers between the multilayered structure stacks, and etching the exposed portions of the substrate and the exposed portions of the plurality of buried insulating layers, which are exposed between the multilayered structures, to form a plurality of first recess spaces in the substrate and the buried insulating layers, the first recess spaces in the substrate having a first substrate depth from an upper surface of the substrate, the first recess spaces in the buried insulating layers having a first insulation depth from the upper surfaces of the buried insulating layers, and
   wherein forming the buried conductive layer includes filling the plurality of first recess spaces.

5. The method as claimed in claim 4, wherein forming the plurality of insulating fence spaces includes:
   exposing portions of the plurality of buried insulating layers in the plurality of first recess spaces by removing portions of the buried conductive layer that correspond to the plurality of fence line areas; and
   forming a plurality of second recess spaces by etching the exposed portions of the plurality of buried insulating layers, the plurality of second recess spaces having a second insulation depth from the upper surfaces of the plurality of buried insulating layers, the second insulating depth being greater than the first insulation depth.

6. The method as claimed in claim 4, wherein forming the plurality insulating fence spaces includes reducing heights of portions of the multilayered stack structures in the plurality of fence line areas while removing portions of the buried conductive layer that correspond to the plurality of fence line areas to thereby form repeating step patterns in the upper surfaces of the plurality of multilayered stack structures, along a lengthwise direction of the multilayered stack structures.

7. The method as claimed in claim 1, wherein forming the plurality of insulating fences includes:
forming insulating line portions and a plurality of insulating plug portions, the insulating line portions extending on the multilayered stack structures in a direction intersecting the multilayered stack structures, the plurality of insulating plug portions extending from the insulating line portions toward the substrate to fill the plurality of insulating fence spaces, the plurality of insulating plugs portions being integrally connected with a corresponding one of the insulating line portions.

8. The method as claimed in claim 1, wherein forming the plurality of insulating fences includes:
forming an insulating layer having a thickness sufficient to fill the plurality of insulating fence spaces;
planarizing the insulating layer so that the plurality of contact plugs are exposed, to thereby form insulating line portions of which upper surfaces extend on the same plane as the upper surfaces of the plurality of contact plugs, and a plurality of insulating plug portions that extending from the insulating line portions toward the substrate to fill the plurality of insulating fence spaces, the plurality of insulating plug portions being integrally connected with a corresponding one of the insulating line portions.

9. A method of manufacturing an integrated circuit device, the method comprising:
forming a plurality of first conductive lines in a substrate to extend parallel to one another in a first direction;
forming a plurality of second conductive lines on the substrate to extend parallel to one another in a second direction that intersects the first direction;
forming a buried conductive layer including a plurality of conductive line patterns that extend on the substrate parallel to the second direction, each of the plurality of conductive line patterns being interposed between each of the plurality of second conductive lines;
removing portions of the buried conductive layer that vertically overlap with the plurality of first conductive lines, to thereby separate the plurality of conductive line patterns of the buried conductive layer from one another as a plurality of contact plugs and, at the same time, form a plurality of insulating fence spaces that alternate with the plurality of contact plugs in the second direction: and
forming a plurality of insulating fences that include a plurality of insulating line patterns filling the plurality of insulating fence spaces, vertically overlapping with the plurality of first conductive lines, and extending parallel to one another.

10. The method as claimed in claim 9, wherein:
forming the buried conductive layer includes forming the buried conductive layer so that portions of the buried conductive layer that vertically overlap with the plurality of first conductive lines have bottom surfaces separated by a first distance from the plurality of first conductive lines, and
forming the plurality of insulating fences includes forming the plurality of insulating fences so that portions of the plurality of insulating fences that vertically overlap with the plurality of first conductive lines have bottom surfaces separated by a second distance from the plurality of first conductive lines, the second distance being shorter than the first distance.

11. The method as claimed in claim 9, further comprising, after forming the plurality of second conductive lines and before forming the buried conductive layer, forming a plurality of insulating spacers that cover opposite sidewalls of each of the plurality of second conductive lines,
wherein forming of the buried conductive layer includes forming the plurality of conductive line patterns to extend parallel to the plurality of second conductive lines, the plurality of conductive line patterns being spaced apart from the plurality of second conductive lines with the plurality of insulating spacers interposed therebetween.

12. The method as claimed in claim 9, wherein forming the plurality of insulating fence spaces includes:
forming a plurality of mask patterns as a line pattern that extend parallel to one another in the first direction on the buried conductive layer to cover an upper surface portion of the buried conductive layer; and
etching portions of the buried conductive layer that are exposed through the plurality of mask patterns, with the plurality of mask patterns as an etch mask.

13. The method as claimed in claim 9, wherein a vertical direction length of the plurality of contact plugs is greater than a vertical direction length of the plurality of insulating fences.

14. The method as claimed in claim 9, wherein forming the plurality of insulating fences includes:
forming an insulating line portion that vertically overlaps with one of the plurality of first conductive lines and extends in the first direction;
forming a plurality of insulating plug portions extending from the insulating line portion to extend between the insulating line portion and the one of the plurality of first conductive lines in a vertical direction toward the substrate.

15. The method as claimed in claim 14, wherein forming the insulating line portion and forming the plurality of insulating plug portions are performed at the same time.

16. A method of manufacturing an integrated circuit device, the method comprising:
forming a plurality of first conductive lines in a substrate to extend parallel to one another in a first direction;
forming a plurality of second conductive lines on the substrate to extend parallel to one another in a second direction that intersects the first direction;
forming a plurality of spaces that extend on the substrate parallel to the second direction, each of the plurality of spaces being interposed between each of the plurality of second conductive lines;
forming a plurality of contact plugs by filling first spaces of the plurality of spaces that extend into the substrate with a conductive material; and
forming insulating fences that include a plurality of insulating line patterns extending parallel to one another by filling second spaces that overlap the plurality of first conductive lines in a third direction that intersects the first and second direction with an insulating material.

17. The method as claimed in claim 16, wherein forming the plurality of spaces include forming the first spaces to a first vertical depth and forming the second spaces to a second vertical depth, larger than the first vertical depth.

18. The method as claimed in claim 17, wherein forming the second spaces included forming spaces to the first vertical depth simultaneously with forming the first spaces and further forming the second spaces to the second vertical depth.

19. The method as claimed in claim 16, wherein, before filling the spaces, forming a plurality of insulating spacers that cover opposite sidewalls of each of the plurality of second conductive lines.

20. The method as claimed in claim 16, wherein forming the insulating fences includes before filling the second spaces with the insulating material:
   filling the second spaces with the conductive material simultaneously with forming the contact plugs; and
   removing the conductive material in the second spaces.

* * * * *